(12) United States Patent
Kim et al.

(10) Patent No.: US 12,338,544 B2
(45) Date of Patent: Jun. 24, 2025

(54) METHOD OF PREPARING A SILICON CARBIDE CRYSTAL BY DEPOSITION ONTO AT LEAST A PAIR OF CONDUCTIVE HEATING ELEMENTS

(71) Applicant: OCI Company Ltd., Seoul (KR)

(72) Inventors: Gabok Kim, Seongnam-si (KR); Byungchang Kang, Seongnam-si (KR); Byunghyun Park, Seongnam-si (KR); Junki Jeon, Seongnam-si (KR); Changwon Jeong, Seongnam-si (KR); Seungan Chyun, Seongnam-si (KR)

(73) Assignee: OCI COMPANY LTD., Seoul (KR)

( * ) Notice: Subject to any disclaimer, the term of this patent is extended or adjusted under 35 U.S.C. 154(b) by 29 days.

(21) Appl. No.: 18/054,439

(22) Filed: Nov. 10, 2022

(65) Prior Publication Data

US 2023/0141427 A1   May 11, 2023

(30) Foreign Application Priority Data

Nov. 11, 2021   (KR) .................. 10-2021-0155113

(51) Int. Cl.
  *C30B 25/10*  (2006.01)
  *C30B 25/18*  (2006.01)
  *C30B 29/36*  (2006.01)

(52) U.S. Cl.
  CPC ............. *C30B 25/10* (2013.01); *C30B 25/18* (2013.01); *C30B 29/36* (2013.01)

(58) Field of Classification Search
  CPC ......... C30B 25/00; C30B 25/02; C30B 25/10; C30B 25/12; C30B 25/16; C30B 25/18;
  (Continued)

(56) References Cited

U.S. PATENT DOCUMENTS 3,147,141 A * 9/1964 Ishizuka ................. C23C 16/22
                                                         118/724
4,315,968 A * 2/1982 Suplinskas .............. C04B 41/89
                                                         428/401
(Continued)

FOREIGN PATENT DOCUMENTS

GB         1029473 A   *  5/1966
JP     S61-295372 A      12/1986
(Continued)

OTHER PUBLICATIONS

Cagliostro, D. et al., "Model for the Formation of Silicon Carbide from the Pyrolysis of Dichlorodimethylsilane in Hydrogen: I, Silicon Formation from Chlorosilanes," Journal of the American Ceramic Society, vol. 76, No. 1, Jan. 1993, 10 pages.
(Continued)

*Primary Examiner* — Kenneth A Bratland, Jr.
(74) *Attorney, Agent, or Firm* — Hauptman Ham, LLP

(57) ABSTRACT

A method of preparing a high-purity silicon carbide (SiC) crystal, and more specifically, to a method of preparing high-purity SiC having an extremely low impurity content in an excellent yield and in large quantities. The method including preparing a reactor containing a reaction chamber; heating the conductive heating element in the reaction chamber; mixing a silicon precursor, a carbon precursor, and a carrier gas; injecting the mixed gas into the reaction chamber, depositing SiC on the conductive heating element and harvesting the deposited SiC crystals.

10 Claims, 18 Drawing Sheets

(58) Field of Classification Search
CPC ......... C30B 28/00; C30B 28/12; C30B 28/14; C30B 29/00; C30B 29/10; C30B 29/36; C23C 16/22; C23C 16/30; C23C 16/32; C23C 16/325; C23C 16/44; C23C 16/46
USPC ... 117/84, 88, 101, 104, 106, 200, 204, 937, 117/951
See application file for complete search history.

(56) References Cited

U.S. PATENT DOCUMENTS

| | | | |
|---|---|---|---|
| 4,702,900 | A | 10/1987 | Kurachi et al. |
| 5,704,985 | A | 1/1998 | Kordina et al. |
| 5,863,325 | A | 1/1999 | Kanemoto et al. |
| 5,937,316 | A | 8/1999 | Inaba et al. |
| 2017/0073233 | A1 | 3/2017 | Park et al. |

FOREIGN PATENT DOCUMENTS

| | | | |
|---|---|---|---|
| JP | S63-123806 | A | 5/1988 |
| JP | H10-12563 | A | 1/1998 |
| JP | 2002-256435 | A | 9/2002 |
| JP | 2003155567 | A | 5/2003 |
| JP | 2005317670 | A | 11/2005 |
| KR | 20060017810 | A | 2/2006 |
| KR | 1020110021530 | A | 3/2011 |
| KR | 20210049251 | A | 5/2021 |
| TW | 201841833 | A | 12/2018 |
| WO | 2009021199 | A1 | 2/2009 |
| WO | 2022/123077 | A1 | 6/2022 |

OTHER PUBLICATIONS

Shin, D. et al., "Impurity behavior of high purity SiC powder during SiC crystal growth," Materials Science Forum, vol. 778-780, Feb. 26, 2014, 4 pages.
Korean Intellectual Property Office, Office Action Issued in Application No. 2022-0099068, Sep. 28, 2022, 13 pages.
European Patent Office, Extended European Search Report Issued in Application No. 22204627.8, May 10, 2023, Germany, 8 pages.
Japanese Patent Office, Office Action Issued in Application No. 2022-179659, Oct. 3, 2023, 6 pages.
Office Action dated Jun. 26, 2024 for corresponding Korean Patent Application No. 10-2022-0150441, along with an English translation (14 pages).
Notice of Allowance issued on Mar. 5, 2025, for corresponding Japanese Patent Application No. 2022--179659, along with an English machine translation (5 pages).
Office Action issued on Mar. 4, 2025, for corresponding Korean Patent Application No. 10-2022-0150441, along with an English machine translation (11 pages).
Jeremy N. Ness et al., "Polytype formation and transformation during the reaction-bonding of silicon carbide", Bulletin de Mineralogie, 1986, vol. 109, pp. 151-161, cited in NPL No. 2.

* cited by examiner

METHOD OF PREPARING A SILICON CARBIDE CRYSTAL BY DEPOSITION ONTO AT LEAST A PAIR OF CONDUCTIVE HEATING ELEMENTS

CROSS-REFERENCE TO RELATED APPLICATION

The present application claims priority to Korean Patent Application No. 10-2021-0155113 filed on Nov. 11, 2021. The entire contents of the above-listed application are hereby incorporated by reference for all purposes.

TECHNICAL FIELD

The present disclosure relates to a method of preparing a high-purity silicon carbide (SiC) crystal, and more specifically, to a method of preparing high-purity SiC having an extremely low impurity content in an excellent yield and in large quantities.

BACKGROUND

Silicon carbide (SiC) has recently been used as a semiconductor material for various electronic devices and purposes. Silicon carbide may be useful because of its physical strength, high chemical inertia, and high resistance to corrosion. Silicon carbide also has a high radiation hardness, a relatively wide bandgap, a high-saturated electron drift velocity, a high operating temperature, and excellent electronic properties including absorption and emission of high-energy protons in the blue, violet, and ultraviolet regions of a spectrum.

A silicon carbide single crystal can be used at high temperatures by replacing Si semiconductors with a maximum operating temperature of 250° C. by using high oxidation resistance and excellent electrical properties. It is chemically stable and has strong resistance to radiation, so it has advantages suitable for manufacturing semiconductor devices operating in special environments. In addition, in the LED industry, since a silicon carbide single crystal is used as a substrate for GaN growth used as an LED substrate, as the LED market is expanding, the demand for high-purity SiC single crystals is increasing, and accordingly, the demand for raw materials required for crystal growth and the required purity are increasing.

Methods for manufacturing a conventional high-purity silicon carbide raw material powder include various methods, and for example, an Acheson method, a carbon thermal reduction method, a liquid phase polymer pyrolysis method, etc. are used. In some embodiments, the method for synthesizing high-purity silicon carbide powder uses a carbon thermal reduction method. That is, the silicon carbide powder may be synthesized by mixing the materials of the carbon source and the silicon source, and performing a carbonization process and a synthesis process for the mixture. However, there are limitations when silicon carbide powder having various crystalline phases and purities is manufactured according to the above conventional method.

Korean Patent Publication No. 10-2011-0021530 (Related Document 1) discloses a technique in which solid silica and a solid carbon raw material are mixed to prepare a high-purity granular silicon carbide powder used for preparing a silicon carbide single crystal by a PVT method, and a thermal carbon reduction reaction is performed at a temperature of 1,600° C. to 1,900° C. to synthesize high-purity silicon carbide powder.

U.S. Pat. No. 4,702,900 (Related Document 2) discloses a technique in which a silicon dioxide-carbon precursor is prepared by selecting a silicon alkoxide and a carbon compound to synthesize a high-purity silicon carbide granular powder in the β phase, and then heat treatment is performed under an inert gas condition, such as vacuum or argon (Ar) to obtain a silicon carbide powder.

U.S. Pat. No. 5,863,325 (Related Document 3) discloses an optimized heat treatment process in which a high-purity β silicon carbide granular powder of several ppm of metallic impurities of the silicon carbide powder prepared by the process is synthesized, and the prepared β phase silicon carbide powder is used as a single crystal raw material.

A bulk SiC close to the theoretical SiC density (3.2 g/cm$^3$) is commercially prepared by CVD, as in U.S. Pat. No. 5,704,985. In this process, silicon and carbon-containing gaseous precursors are reacted at an elevated temperature, typically 1,200° C. to 1,400° C. to form solid SiC, which is typically deposited on a suitable substrate such as graphite. A single precursor containing both Si and C atoms, for example trimethylsilane, may also be used. Although high-purity precursors are available, commercial grade bulk SiC produced by CVD is not sufficiently pure for use as a crystal source in SiC crystal growth, particularly for semi-insulated SiC crystals, as commercial grade bulk SiC typically contains boron (0.7 to 2 ppm), metallic impurities and nitrogen (100 ppm or less).

However, since the conventional method described above has a problem that it is difficult to economically prepare a silicon carbide powder and cannot be prepared in high purity, there is still a need for research on a method for mass production of high-purity SiC crystals.

SUMMARY

An object of the present disclosure is to address the limitations of the conventional preparation method and to provide a method of preparing high-purity SiC having an extremely low impurity content in an excellent yield and in large quantities.

Another object of the present disclosure is to provide a SiC crystal having a single phase having a beta (β) phase or a complex phase in which α and β phases coexist.

The present disclosure provides a method of preparing high-purity SiC crystals, the method including: i) preparing a reactor containing a reaction chamber including a pair of electrodes connected to a power source and at least one pair of conductive heating elements electrically connected to the electrodes; ii) heating the conductive heating elements; iii) mixing a silicon source precursor, a carbon source precursor and a carrier gas; iv) injecting the mixed gas into the reaction chamber; v) depositing SiC on the conductive heating elements; and vi) harvesting the deposited SiC crystals by separating the same from the conductive heating element.

In the present disclosure, the temperature of the conductive heating element may be raised to 1,000° C. to 1,800° C., and accordingly, the temperature inside the reaction chamber may be heated to 1,000° C. to 1,500° C.

The conductive heating element may be selected from molybdenum (Mo), tungsten (W), platinum (Pt), graphite, carbon fiber reinforced carbon (CFRC), SiC and polysilicon.

The conductive heating elements may have one or more pairs of filaments.

The SiC deposition rate on the conductive heating elements may be 10 g/hr or more.

The silicon source precursor may be one or more selected from trichlorosilane (TCS), dichlorosilane (DCS), silicon tetrachloride (STC) and monosilane.

The silicon source precursor may be trichlorosilane (TCS).

The carbon source precursor may be propane ($C_3H_8$).

The carrier gas may be hydrogen ($H_2$).

The atomic ratio of Si:C between the silicon source precursor and the carbon source precursor in the mixed gas may be 0.5 to 2:1.

The atomic ratio of Si:C between the silicon source precursor and the carbon source precursor in the mixed gas may be 1:1.

The present disclosure provides a SiC crystal prepared according to the above-described method, wherein the SiC crystal has a purity of 6 N or more.

The SiC crystals may have a single phase of a β phase or a complex phase in which an α phase and a β phase coexist.

The SiC crystal may have a total content of metallic impurities of 1 ppm or less.

In some aspects, the preparation method of the present disclosure enables mass production of high-purity SiC crystals with excellent yield.

In addition, according to the method of the present disclosure, it becomes possible to improve the quality and productivity of the SiC crystals.

In addition, according to the preparation method of the present disclosure, a high-purity SiC crystal having a total content of metallic impurities of 1 ppm or less can be provided, and the high-purity SiC crystals may have a single phase of a β phase or a complex phase in which an α phase and a β phase coexist.

DETAILED DESCRIPTION

Figure 1:
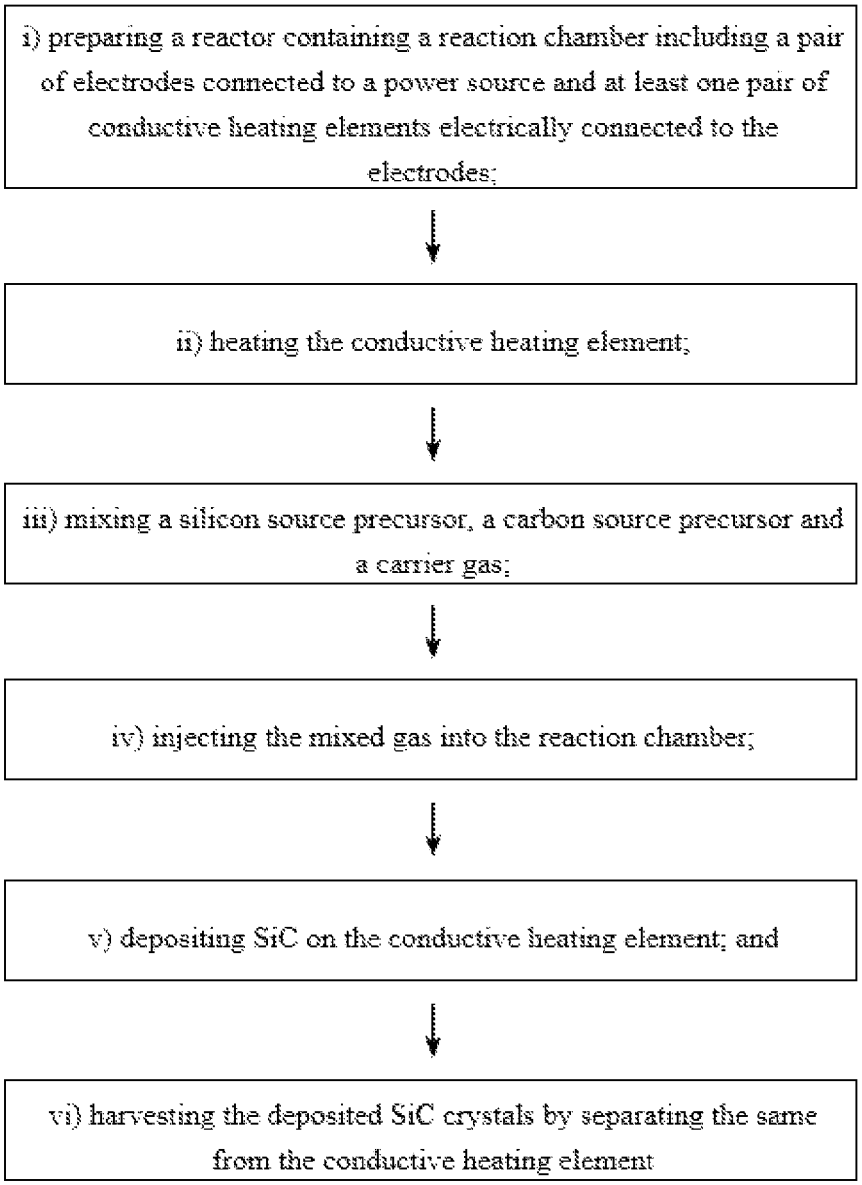
FIG. 1 shows a process flow diagram for preparing high-purity SiC crystals according to an embodiment of the present disclosure.

Hereinafter, embodiments of the present disclosure will be described in detail with reference to the accompanying drawings so as to be easily carried out by those skilled in the art to which the present disclosure pertains. However, the present disclosure may be embodied in many different forms and is not limited to the embodiments set forth herein. In order to clearly illustrate the present disclosure in the drawings, portions that are not described are omitted, and the same reference numerals are assigned to the same or similar elements throughout the specification.

In the description of the embodiments, a case that each layer (film), layer, pattern, or structures are formed "on" or "under" a substrate, each layer, region, pad includes all those formed directly or through another layer. The criteria for the upper/above or lower/below layers of each layer will be described with reference to the drawings.

In the drawings, the thickness or size of each layer (film), region, pattern, or structure may be changed for clarity and convenience of description, and thus does not fully reflect the actual size.

Hereinafter, an embodiment of the present disclosure will be described in detail with reference to the accompanying drawings.

The present disclosure provides a method of producing high-purity SiC crystals in large quantities by chemical vapor deposition (CVD).

A method of producing high-purity SiC crystals according to the present disclosure includes: i) preparing a reactor containing a reaction chamber including a pair of electrodes connected to a power source and at least one pair of conductive heating elements electrically connected to the electrodes; ii) heating the conductive heating elements; iii) mixing a silicon source precursor, a carbon source precursor and a carrier gas; iv) injecting the mixed gas into the reaction chamber; v) depositing SiC on the conductive heating elements; and vi) harvesting the deposited SiC crystals by separating the same from the conductive heating element (FIG. 1).

Figure 2:
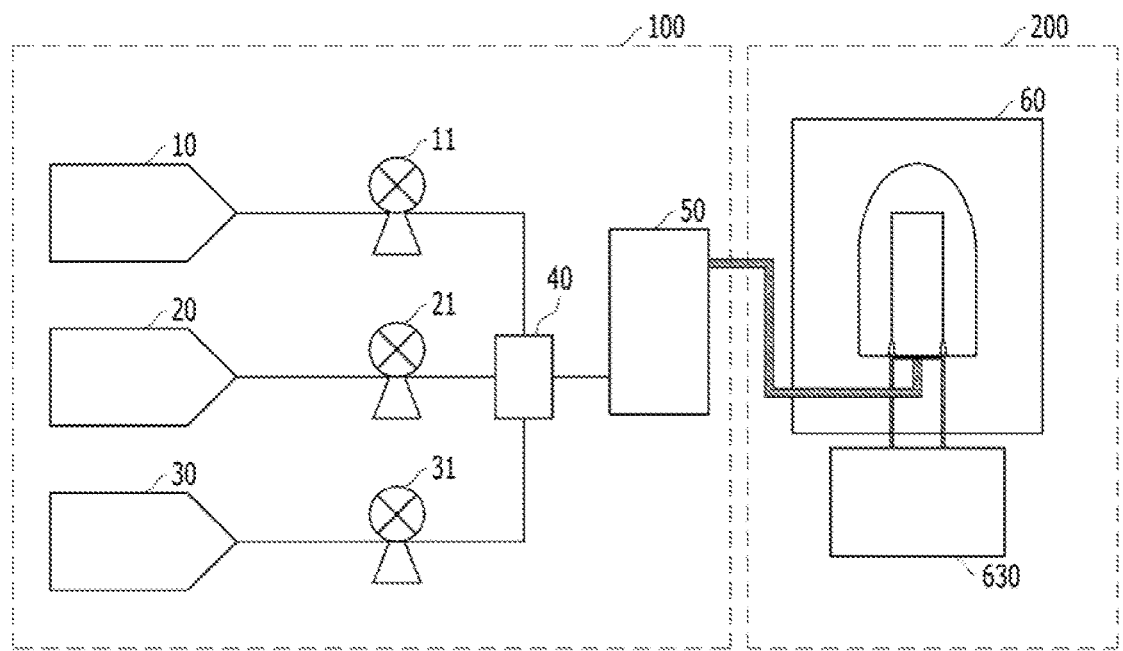
FIG. 2 is a block diagram schematically showing a system for mass production of high-purity SiC crystals according to the present disclosure.

FIG. 2 is a block diagram schematically showing a system for mass production of SiC according to the present disclosure. An apparatus configuration not shown with reference to FIG. 2 is equally applicable with reference to a commonly used chemical vapor deposition (CVD) reactor.

As shown in the figures, the SiC mass production system according to the present disclosure is largely composed of a raw material supply part 100 and a reaction part 200.

The raw material supply part 100 includes a silicon source precursor supply part 10, a carbon source precursor supply part 20 and a carrier gas supply part 30, a mixer 40, and a vaporizer 50, and flow meters 11, 21, and 31 for adjusting the flow rates of the silicon source precursor supply part 10, the carbon source precursor supply part 20 and the carrier gas supply part 30, respectively, are provided. As examples of the flow meters 11, 21, and 31 that enable fluid communication to be selected, an MFC, LMFC, LFC, or the like may be used.

As a silicon source precursor supplied to the silicon source precursor supply part 10, monosilane or a halosilane represented by a general formula $SiH_nX_{4-n}$ (n=0, 1, 2, 3; X=Cl, Br, I) is used. In some embodiments, a chlorosilane-based compound may be used. Specifically, trichlorosilane (TCS), dichlorosilane (DCS), silicon tetrachloride (STC) or monosilane, such as trichlorosilane ($SiHCl_3$, TCS) may be used.

The carbon source precursor supplied to the carbon source precursor supply part 20 may be a hydrocarbon compound such as methane, ethane, or propane, such as propane ($C_3H_8$).

The carrier gas supplied to the carrier gas supply part 30 may be hydrogen ($H_2$) or a mixture of hydrogen ($H_2$) and an inert gas (He, Ar, $N_2$), such as hydrogen ($H_2$).

The pressure inside the silicon source precursor supply part 10, the carbon source precursor supply part 20 and the carrier gas supply part 30 is 2 to 4 bar.

The mixer 40 uniformly mixes the raw materials supplied from the flow meters 11, 21, and 31, and then introduces the gas mixture into the reactor 60 through the vaporizer 50. The gas mixture includes a silicon source precursor, a carbon source precursor and a carrier gas. The vaporizer 50 enables volumetric delivery of low volatility materials, leading to reproducible delivery and deposition without thermal decomposition of the precursor. The pressure and temperature in the vaporizer 50 may be adjusted, such as the pressure in the vaporizer 50 is 0 to 4 bar, and the temperature in the vaporizer 50 may be in the range of 50° C. to 400° C., or 100° C. to 200° C.

The atomic ratio of Si:C:H in the mixed gas including the silicon source precursor, the carbon source precursor, and the carrier gas introduced into the mixer 40 may be selected according to the content of chemical elements and the stoichiometric ratio of chemical elements.

In one aspect of the present disclosure, the atomic ratio of Si:C between the silicon source precursor and the carbon source precursor in the mixed gas may be 0.5 to 2:1, or 0.75 to 1.5:1, or 1:1. When the above range is satisfied, the crystallinity and uniformity of the SiC deposited on the conductive heating element are good, and the conversion efficiency of the supplied mixed gas to SiC is increased.

Figure 3:
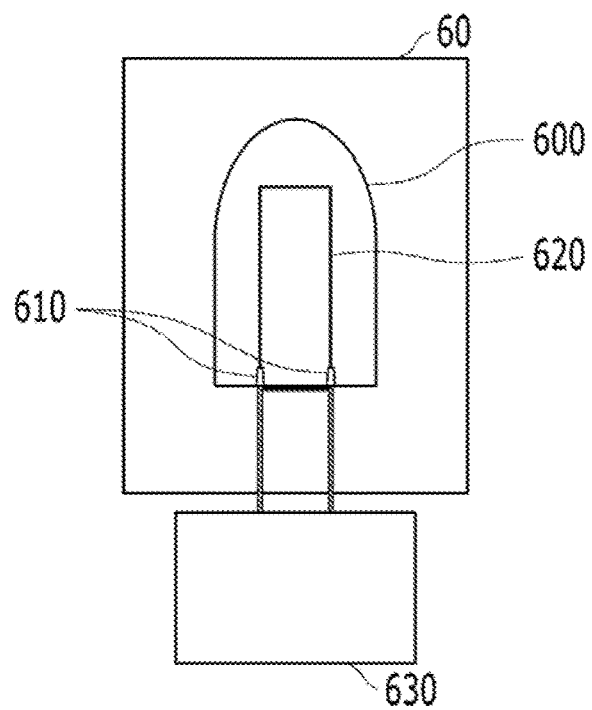
FIG. 3 is a configuration diagram schematically showing a reactor in the mass production system disclosed in FIG. 2.

FIG. 3 is a configuration diagram schematically showing a reactor in the mass preparation system disclosed in FIG. 2.

In one aspect of the present disclosure, the reactor 60 includes: a reaction chamber 600 including a substrate and a reactor cover; at least one pair of electrodes 610 installed through the substrate and connected to a power source; and one or more pairs of conductive heating elements 620 coupled to each of the pair of electrodes by an electrode chuck and having upper ends connected to each other.

The reactor 60 forms a reaction chamber 600 on a substrate, and the reactor cover is coupled to the substrate to have a gas tight structure. The reactor 60 includes a bell jar forming a reaction chamber 600, and a chamber cover spaced apart from the bell jar to flow a coolant between the bell jar and the chamber.

One or more pairs of conductive heating elements 620 in the reactor are connected to an external electrical energy source 630 through electrodes and electrode terminals at the lower end of the reaction chamber 600 substrate. Accordingly, the conductive heating element 620 forms one electric circuit, and electric current is applied through the electrodes and the electrode terminals to be heated.

The conductive heating element 620 may be one or more pairs of filaments, and these filaments may have any shape. In one aspect of the present disclosure, the filaments may be one or more pairs of rod filaments. The one pair of rod filaments may be formed as a hairpin or U-shaped rod by two rod filaments spaced apart from each other and standing upright in the reaction chamber and one horizontal rod filament horizontally connecting the two uppermost ends thereof. In addition, the two rod filaments have their lower ends connected to an external electrical energy source through an electrode and an airtight terminal, so that one set of rod filaments forms a complete electric circuit.

The present disclosure deposits SiC on the conductive heating element 620 by directly heating the conductive heating element 620, unlike the related art of indirectly heating a deposition surface on which SiC is deposited in the reactor. Accordingly, a SiC crystal phase can be finely controlled by controlling the heating temperature of the conductive heating element 620, and a deposition rate of SiC can be significantly improved, and SiC crystals with high purity and high yield can be obtained.

As a material of the conductive heating element 620 of the present disclosure, a material having a high melting point or a silicon material is used. Due to high thermal stability of the conductive heating element 620 material of the present disclosure, oxidation, corrosion, cracking, and the like of the deposition surface are prevented, and ultimately, a high-purity SiC crystal can be obtained.

In some embodiments, the material of the conductive heating element 620 has high strength at a high temperature compared to metal materials and can be used in an ultra-high temperature state of 2000° C. or higher under an inert atmosphere, thereby providing high thermal stability.

The conductive heating element 620 of the present disclosure may be made of a material including one or more of the group consisting of molybdenum (Mo), tungsten (W), platinum (Pt), graphite, carbon fiber reinforced carbon (CFRC), SiC, and polysilicon. In some aspects, the material may include one or more of tungsten (W), and/or a carbon fiber reinforced carbon (CFRC). In one aspect, the conductive heating element 620 may be manufactured using the carbon fiber reinforced carbon (CFRC) having excellent chemical stability properties such as thermal stability, dimensional stability, strength, and corrosion resistance under ultra-high temperature.

The carbon fiber reinforced carbon (CFRC) of the present disclosure includes a carbon fiber reinforced carbon composite (CFRC composite) or a carbon/carbon material (C/C material). The carbon fiber reinforced carbon (CFRC) is light weight, and has high strength, high elasticity, high durability, and high impact resistance. In some embodiments, compared with isotropic graphite materials, the carbon fiber reinforced carbon (CFRC) has high strength, is not easily bent, and does not crack. Thus, CFRC provides SiC crystals with high purity and high yield even at high temperatures.

As an example of the carbon fiber reinforced carbon (CFRC), the carbon fiber reinforced carbon composite including a reinforced matrix may be used, and the composite may include a matrix made of carbide such as a thermosetting resin or pitch and carbon fibers.

The conductive heating element 620 may be heated to 1,000° C. to 1,800° C. by receiving power from the electrical energy source 630, and may be heated to 1,400° C. to 1,600° C. When the above range is satisfied, SiC crystals having a high yield can be obtained. In addition, the deposition rate of SiC on the conductive heating element 620 is improved, and the grown SiC has excellent crystallinity, uniformity, and surface morphology. Ultimately, the method of preparing SiC crystals according to the present disclosure improves the quality and productivity of the SiC crystals.

As the conductive heating element 620 is heated, the temperature inside the reactor rises. The temperature in the reactor may be controlled, and in one embodiment of the present disclosure, it may be heated to about 1,000° C. to 1,500° C.

The silicon source precursor in the mixed gas introduced into the reactor 60 is thermally decomposed and reacts with the carbon source precursor to deposit SiC on the conductive heating element, generating SiC crystals having a thickness greater than or equal to a predetermined thickness.

In one aspect of the present disclosure, a large amount of SiC crystals in bulk form may be obtained from a reaction chamber including one or more pairs of conductive heating elements.

The deposition time of SiC crystals may be adjusted for SiC crystals with desired thickness and particle size. The deposition rate may depend on one or more process parameters including, but not limited to, the deposition temperature, the flow rate of the mixed gas introduced into the reaction chamber through the vaporizer, the temperature of the vaporizer, and/or the pressure of the reactor.

In one aspect of the present disclosure, the deposition rate of SiC may be at least 10 g/hr or more, preferably 20 g/hr or more, 30 g/hr or more, 40 g/hr or more, 50 g/hr or more, and, particularly preferably, 60 g/hr or more.

If necessary, the pressure in the reactor may be adjusted, and in one aspect of the present disclosure, may be 1 bar to 3 bar.

After the SiC crystals harvested in the reactor 60 are pulverized/crushed through a separate device, the SiC single crystal powder classified according to particle size may be packaged after etching/cleaning.

In one aspect of the present disclosure, the SiC crystals prepared by the above-described method have a high purity of 6N or more, preferably 7N or more, 8N or more, and particularly preferably, 9N or more.

The SiC crystal has an all impurity metal atom content of 1 ppm or less, preferably 0.9 ppm or less, 0.8 ppm or less, 0.7 ppm or less, 0.6 ppm or less, 0.5 ppm or less, 0.4 ppm or less, 0.3 ppm or less, 0.2 ppm or less, more preferably 0.1 ppm or less. Moreover, the content is especially preferably 0.05 ppm or less, 0.04 ppm or less, 0.03 ppm or less, 0.02 ppm or less, or 0.01 ppm or less.

The SiC crystals may be a single phase of a β phase or a mixed phase of an α phase and a β phase, and the mixed phase has an almost stoichiometric composition. When the SiC crystals have a mixed phase of an α phase and a β phase, most of the crystal phases may be a β phase.

Most of the SiC crystals prepared when the temperature inside the reaction chamber is 1000° C. to 1500° C. are β phase. However, when the temperature of the center inside the SiC crystals rises to about 1,800° C. or more in the deposition step, a phase transition occurs in the center, and it is considered that the SiC crystals have a mixed phase of an α phase and a β phase.

Meanwhile, the SiC crystals having the β phase alone or as a major composition according to the present disclosure have excellent electrical properties and high purity during manufacture, so they can be used in the field of electrical materials, especially semiconductors, and have high thermal conductivity and excellent heat resistance.

Hereinafter, the present disclosure will be described in detail based on examples, but the present disclosure is not limited by the examples.

EXAMPLES

Example 1

The experiment was carried out according to the process flow diagram for preparing high-purity SiC crystals shown in FIG. 1, but a conductive heating element made of tungsten (W) was installed in the reactor for chemical vapor deposition and connected to an electrode. The conductive heating element was heated so that the temperature inside the reaction chamber was about 1050° C. (measured by a pyrometer). TCS ($SiHCl_3$) was used as a silicon source precursor, propane ($C_3H_8$) was used as a carbon source precursor, and hydrogen ($H_2$) was used as a carrier gas. They were mixed in a mixer and then vaporized and injected into the reaction chamber. At this time, the atomic ratio of Si:C:H in TCS, propane, and hydrogen each present in the mixed gas was 0.75:1:5, the mixed gas was injected at a rate of 10 SLM and the deposition process was performed at the SiC deposition rate of 25.37 g/hr.

Figure 4:
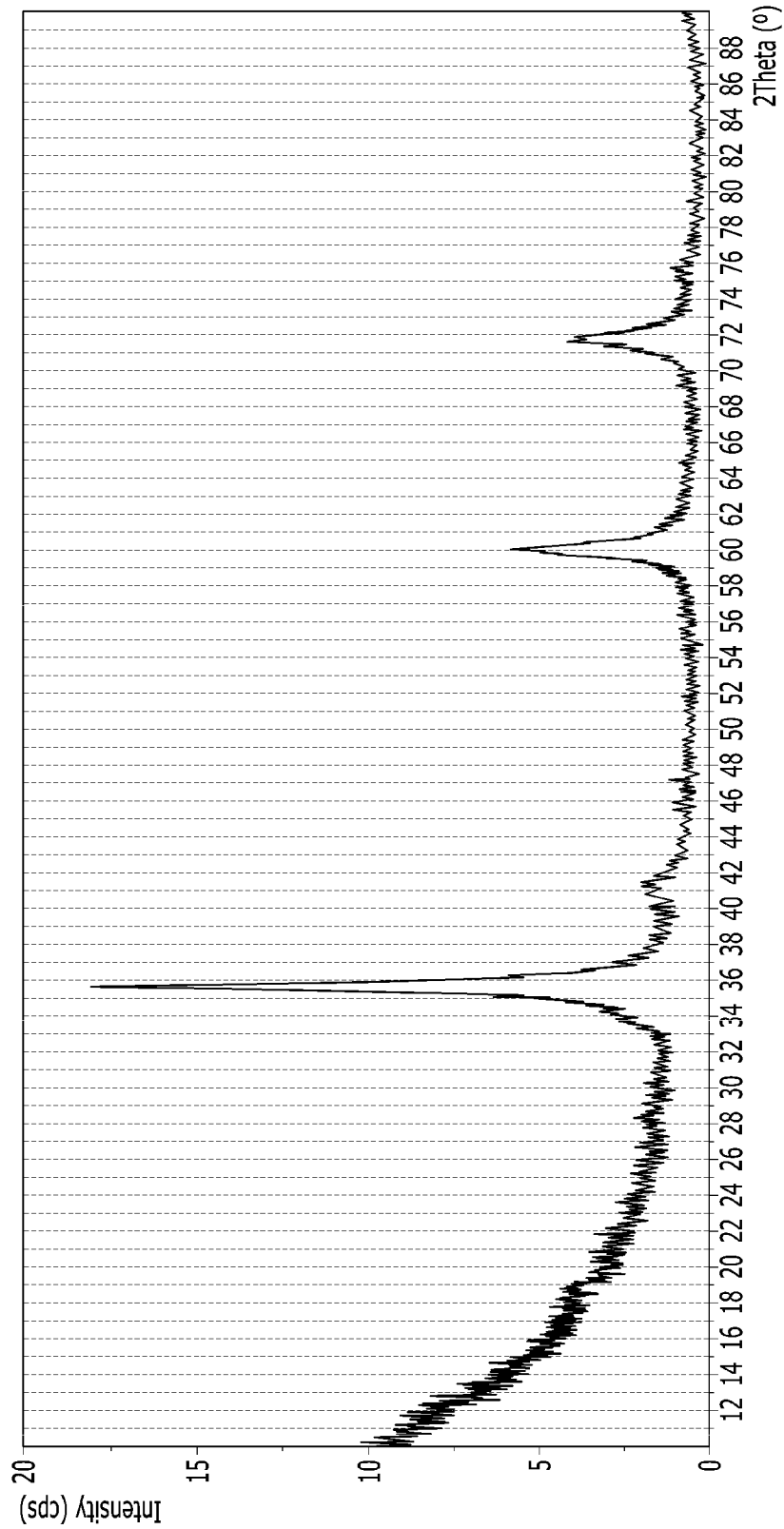
FIGS. 4 to 19 show the peaks of the β phase and/or the α phase in the SiC crystals prepared in Examples 1 to 16.

The SiC crystals deposited on the conductive heating element were separated and harvested, and the density of the harvested SiC was 3.18 g/cm³. In order to analyze the physical properties of the harvested SiC, X-ray diffraction analysis was performed, and as a result, it can be confirmed that the peak of the β phase was the largest as shown in FIG. 4.

Example 2

A conductive heating element made of tungsten (W) was installed in the reactor for chemical vapor deposition and connected to an electrode. The conductive heating element was heated so that the temperature inside the reaction chamber was about 1050° C. (measured by a pyrometer), TCS ($SiHCl_3$) was used as a silicon source precursor, propane ($C_3H_8$) was used as a carbon source precursor, and hydrogen ($H_2$) was used as a carrier gas. They were mixed in a mixer and then vaporized and injected into the reaction chamber. At this time, the atomic ratio of Si:C:H in TCS, propane, and hydrogen each present in the mixed gas was 0.75:1:5. The mixed gas was injected at a rate of 10 SLM and the deposition process was performed at the SiC deposition rate of 24.20 g/hr.

Figure 5:
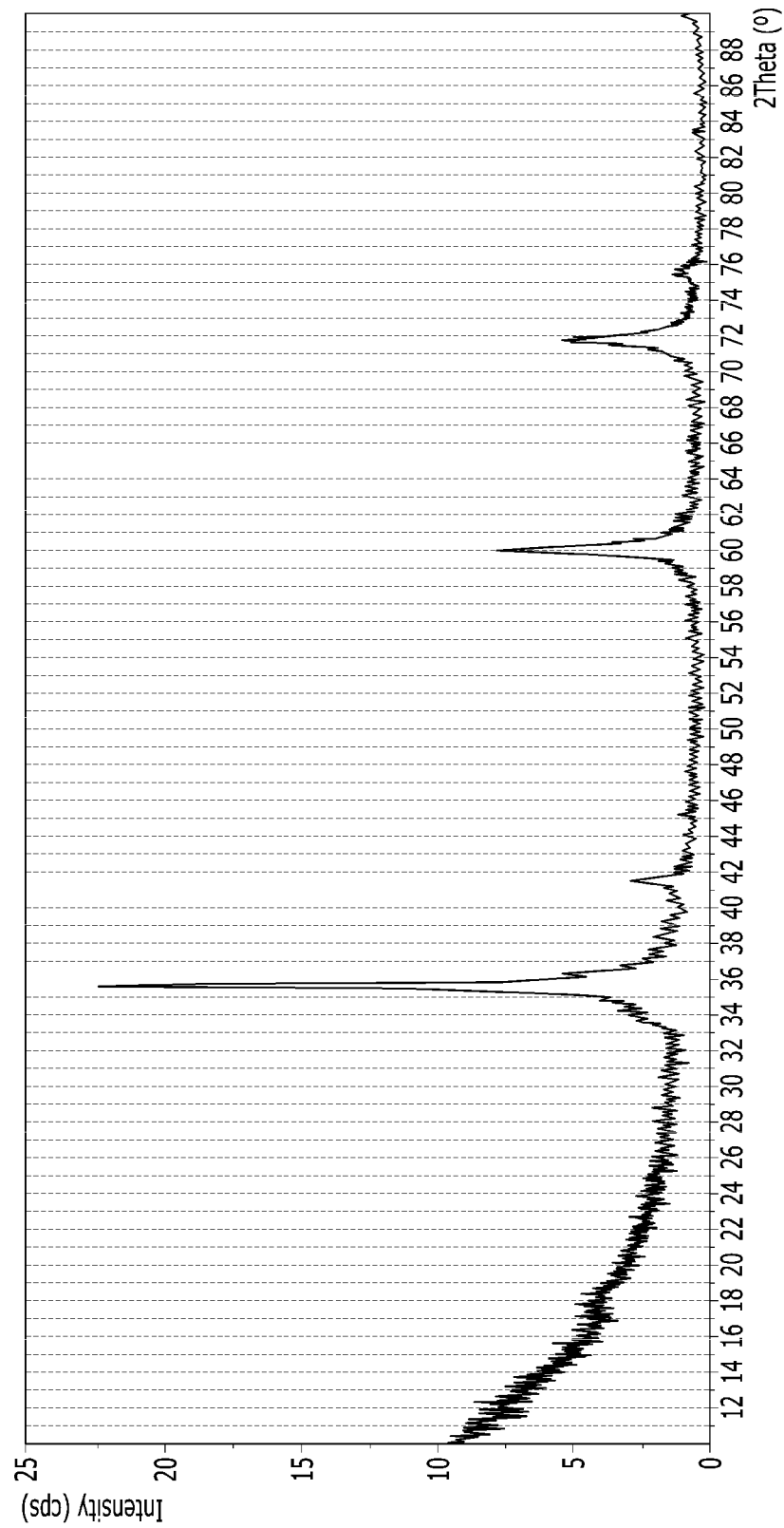

The SiC crystals deposited on the conductive heating element were separated and harvested, and the density of the harvested SiC was 3.16 g/cm³. In order to analyze the physical properties of the harvested SiC, X-ray diffraction analysis was performed, and as a result, it can be confirmed that the peak of the β phase was the largest as shown in FIG. 5.

Example 3

A conductive heating element made of graphite was installed in the reactor for chemical vapor deposition and connected to an electrode. The conductive heating element was heated so that the temperature inside the reaction chamber was about 1050° C. (measured by a pyrometer), TCS ($SiHCl_3$) was used as a silicon source precursor, propane ($C_3H_8$) was used as a carbon source precursor, and hydrogen ($H_2$) was used as a carrier gas. They were mixed in a mixer and then vaporized and injected into the reaction chamber. At this time, the atomic ratio of Si:C:H in TCS, propane, and hydrogen each present in the mixed gas was 0.75:1:5. The mixed gas was injected at a rate of 10 SLM and the deposition process was performed at the SiC deposition rate of 11.05 g/hr.

Figure 6:
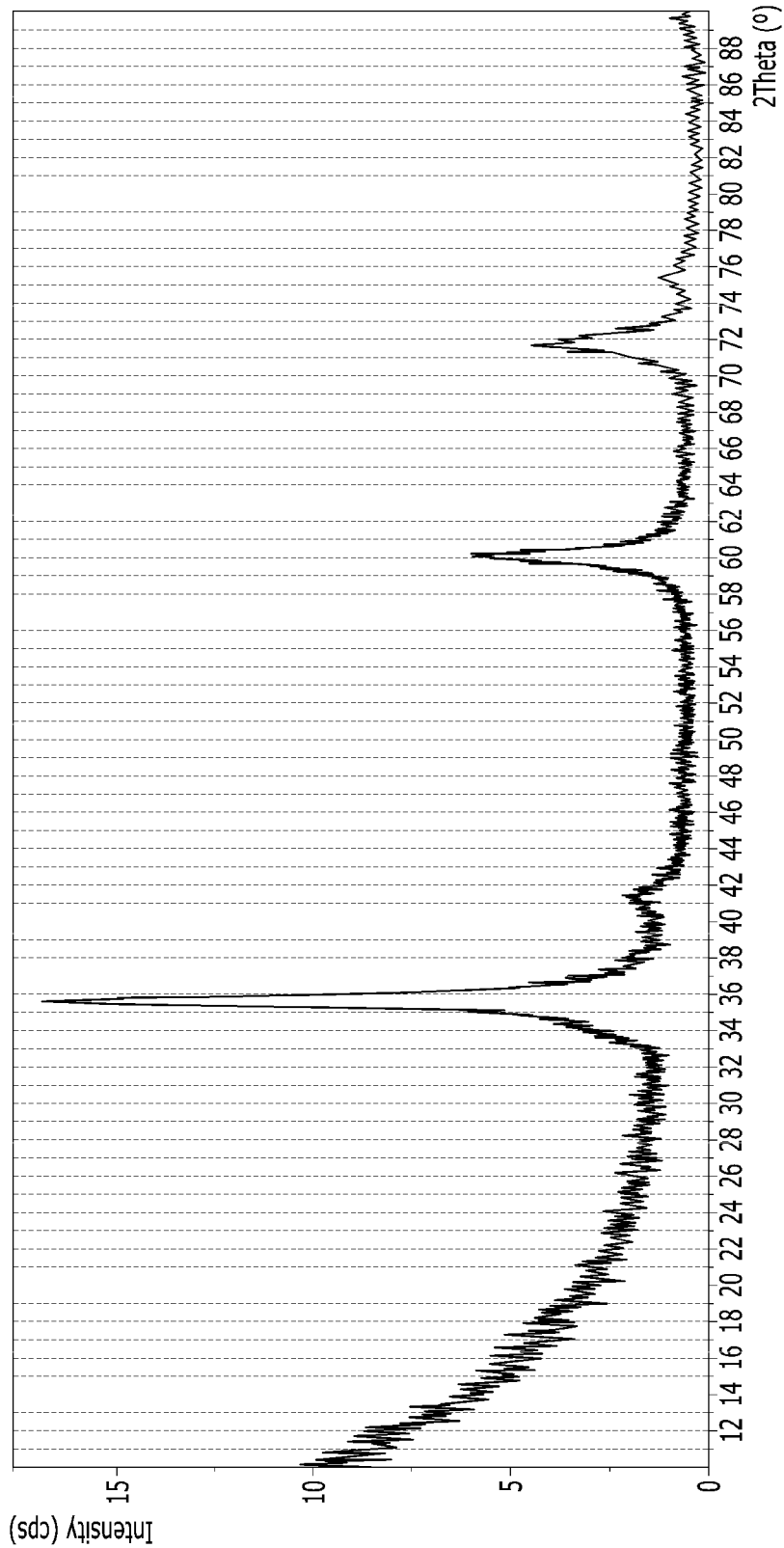

The SiC crystals deposited on the conductive heating element were separated and harvested, and the density of the harvested SiC was 3.22 g/cm³. In order to analyze the physical properties of the harvested SiC, X-ray diffraction analysis was performed, and as a result, it can be confirmed that the peak of the β phase was the largest as shown in FIG. 6.

Example 4

A conductive heating element made of graphite was installed in the reactor for chemical vapor deposition and connected to an electrode. The conductive heating element was heated so that the temperature inside the reaction chamber was about 1150° C. (measured by a pyrometer), TCS ($SiHCl_3$) is used as a silicon source precursor, propane ($C_3H_8$) was used as a carbon source precursor, and hydrogen ($H_2$) was used as a carrier gas. They were mixed in a mixer and then vaporized and injected into the reaction chamber. At this time, the atomic ratio of Si:C:H in TCS, propane, and hydrogen each present in the mixed gas was 0.75:1:5.5. The mixed gas was injected at a rate of 10 SLM and the deposition process was performed at the SiC deposition rate of 47.69 g/hr.

Figure 7:
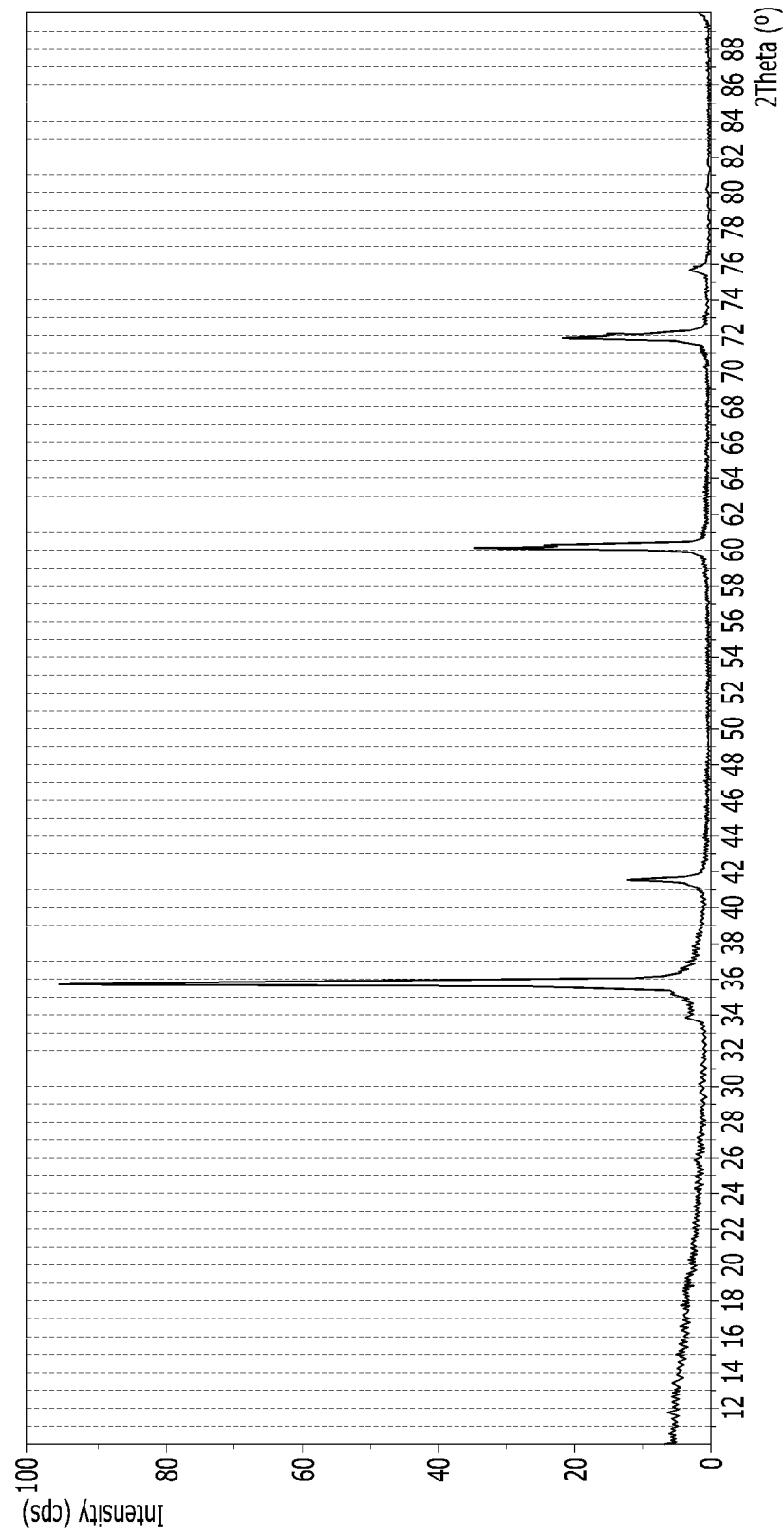

The SiC crystals deposited on the conductive heating element were separated and harvested, and the density of the harvested SiC was 3.16 g/cm³. In order to analyze the physical properties of the harvested SiC, X-ray diffraction analysis was performed, and as a result, it can be confirmed that the peak of the β phase was the largest as shown in FIG. 7.

Example 5

A conductive heating element made of silicon was installed in the reactor for chemical vapor deposition and connected to an electrode. The conductive heating element was heated so that the temperature inside the reaction chamber was about 1050° C. (measured by a pyrometer), TCS ($SiHCl_3$) was used as a silicon source precursor, propane ($C_3H_8$) was used as a carbon source precursor, and hydrogen ($H_2$) was used as a carrier gas. They were mixed in a mixer and then vaporized and injected into the reaction chamber. At this time, the atomic ratio of Si:C:H in TCS, propane, and hydrogen each present in the mixed gas was 0.75:1:5.5. The mixed gas was injected at a rate of 10 SLM and the deposition process was performed at the SiC deposition rate of 24.32 g/hr.

Figure 8:
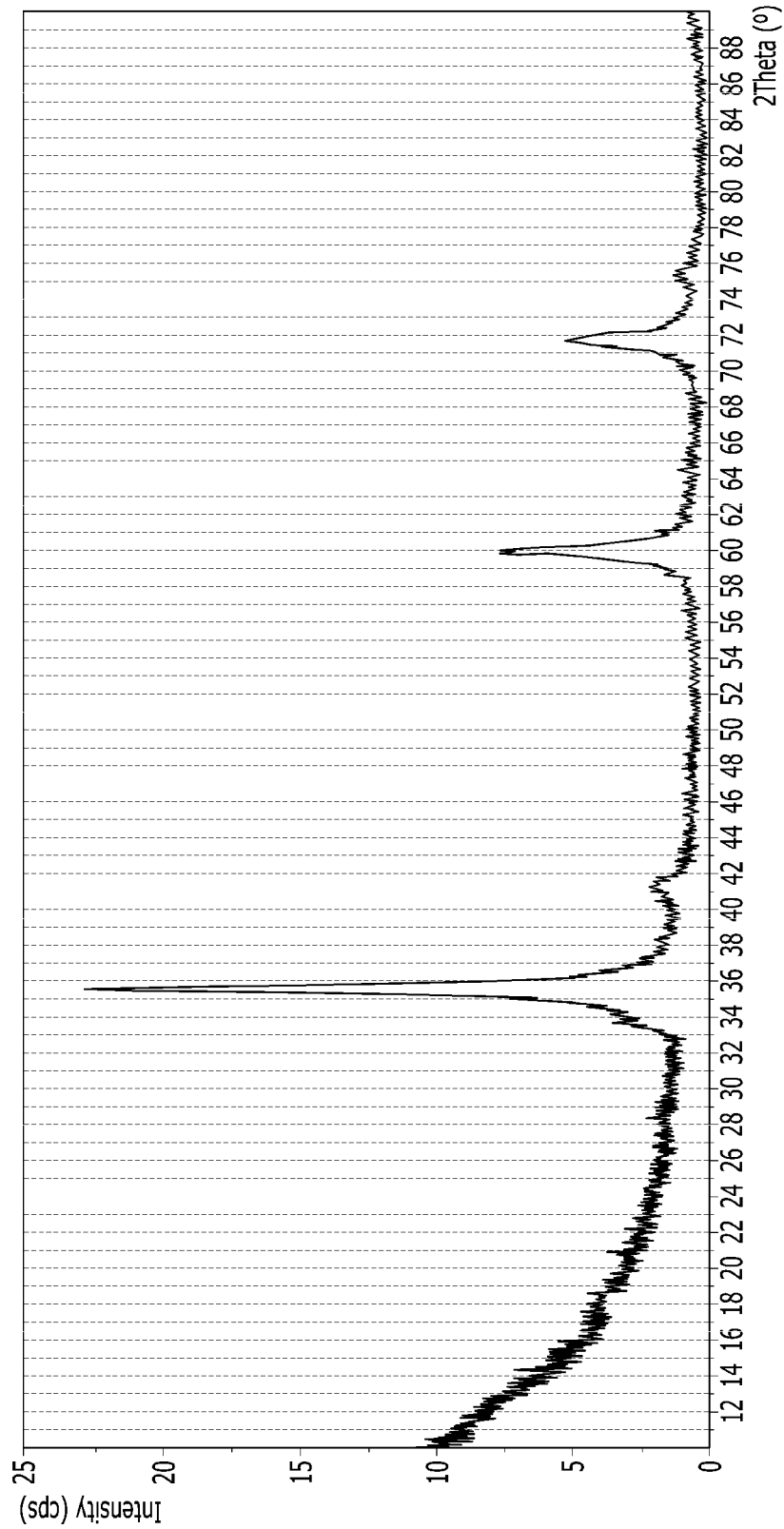

The SiC crystals deposited on the conductive heating element were separated and harvested, and the density of the harvested SiC was 3.18 g/cm$^3$. In order to analyze the physical properties of the harvested SiC, X-ray diffraction analysis was performed, and as a result, it can be confirmed that the peak of the β phase was the largest as shown in FIG. 8.

Example 6

A conductive heating element made of silicon was installed in the reactor for chemical vapor deposition and connected to an electrode. The conductive heating element was heated so that the temperature inside the reaction chamber was about 1100° C. (measured by a pyrometer), TCS ($SiHCl_3$) was used as a silicon source precursor, propane ($C_3H_8$) was used as a carbon source precursor, and hydrogen ($H_2$) was used as a carrier gas. They were mixed in a mixer and then vaporized and injected into the reaction chamber. At this time, the atomic ratio of Si:C:H in TCS, propane, and hydrogen each present in the mixed gas was 0.75:1:5.5. The mixed gas was injected at a rate of 10 SLM and the deposition process was performed at the SiC deposition rate of 26.53 g/hr.

Figure 9:
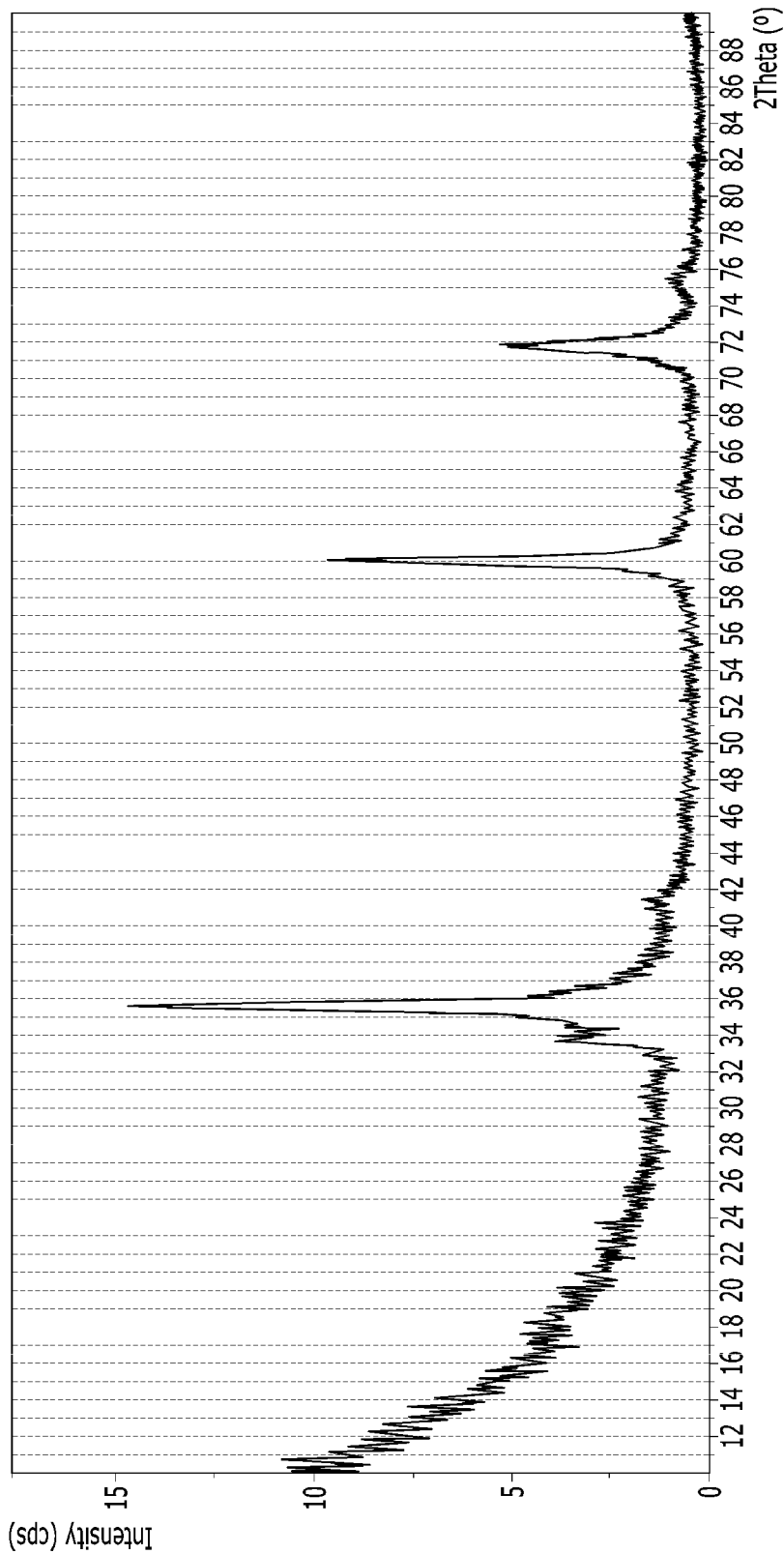

The SiC crystals deposited on the conductive heating element were separated and harvested, and the density of the harvested SiC was 3.22 g/cm$^3$. In order to analyze the physical properties of the harvested SiC, X-ray diffraction analysis was performed, and as a result, it can be confirmed that the peak of the β phase was the largest as shown in FIG. 9.

Example 7

A conductive heating element made of silicon was installed in the reactor for chemical vapor deposition and connected to an electrode. The conductive heating element was heated so that the temperature inside the reaction chamber was about 1170° C. (measured by a pyrometer), TCS ($SiHCl_3$) was used as a silicon source precursor, propane ($C_3H_8$) was used as a carbon source precursor, and hydrogen ($H_2$) was used as a carrier gas. They were mixed in a mixer and then vaporized and injected into the reaction chamber. At this time, the atomic ratio of Si:C:H in TCS, propane, and hydrogen each present in the mixed gas was 0.75:1:5.5. The mixed gas was injected at a rate of 10 SLM and the deposition process was performed at the SiC deposition rate of 32.07 g/hr.

Figure 10:
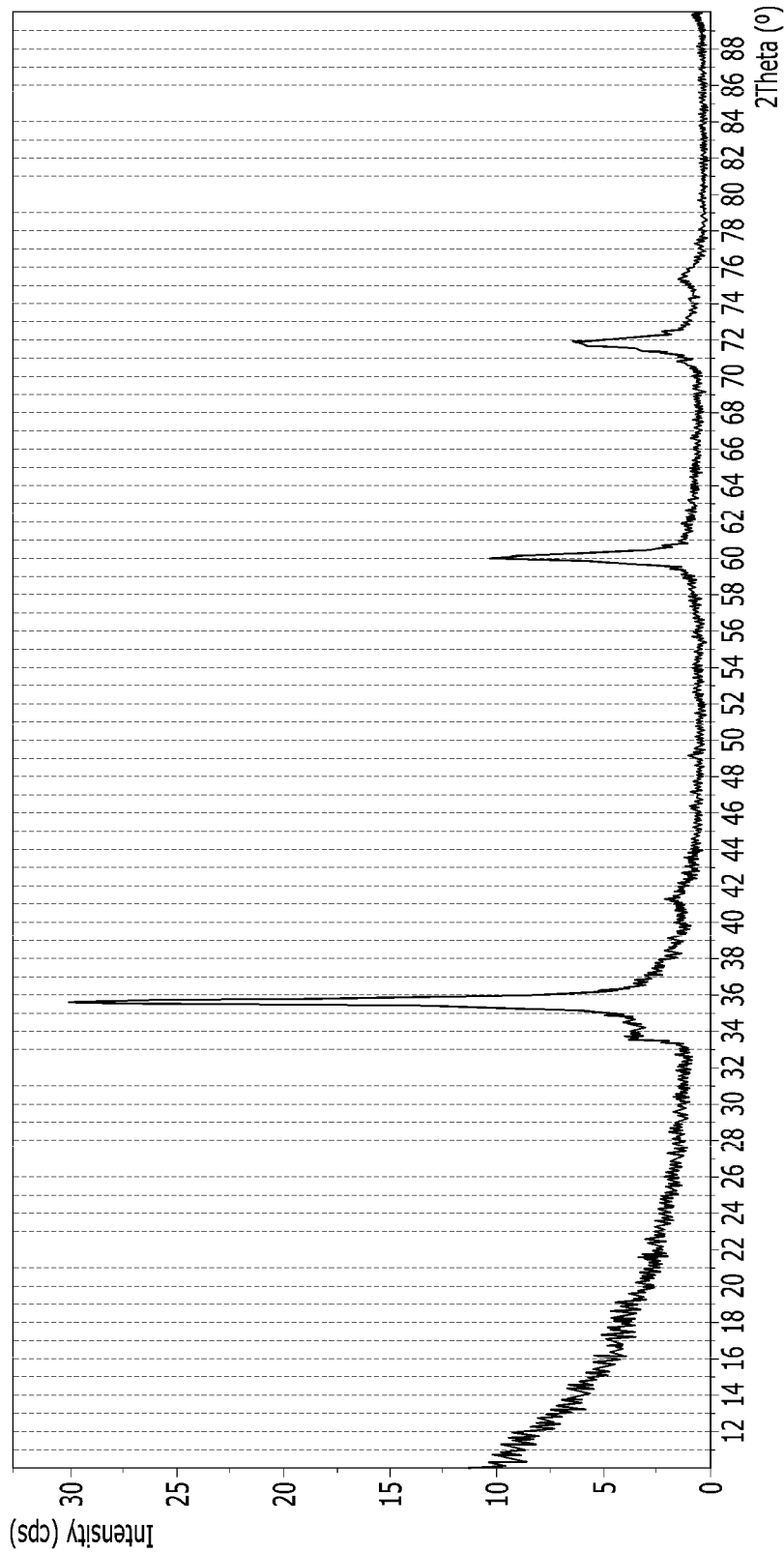

The SiC crystals deposited on the conductive heating element were separated and harvested, and the density of the harvested SiC was 3.19 g/cm$^3$. In order to analyze the physical properties of the harvested SiC, X-ray diffraction analysis was performed, and as a result, it can be confirmed that the peak of the β phase was the largest as shown in FIG. 10.

Example 8

A conductive heating element made of silicon was installed in the reactor for chemical vapor deposition and connected to an electrode. The conductive heating element was heated so that the temperature inside the reaction chamber was about 1050° C. (measured by a pyrometer), TCS ($SiHCl_3$) was used as a silicon source precursor, propane ($C_3H_8$) was used as a carbon source precursor, and hydrogen ($H_2$) was used as a carrier gas, and they were mixed in a mixer and then vaporized and injected into the reaction chamber. At this time, the atomic ratio of Si:C:H in TCS, propane, and hydrogen each present in the mixed gas was 0.75:1:5, and the mixed gas was injected at a rate of 10 SLM, and the deposition process was performed at the SiC deposition rate of 25.05 g/hr.

Figure 11:
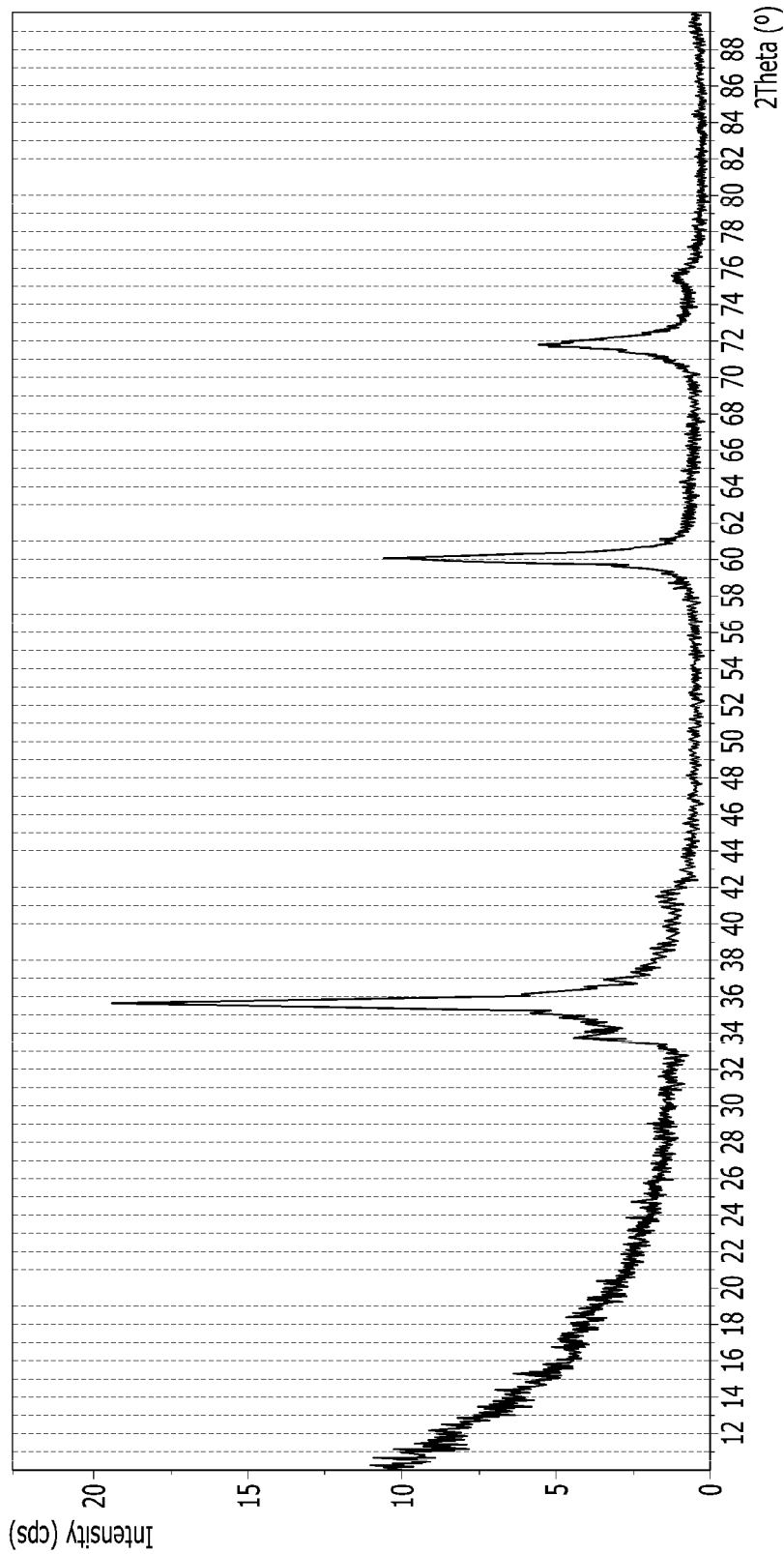

The SiC crystals deposited on the conductive heating element were separated and harvested, and the density of the harvested SiC was 3.15 g/cm$^3$. In order to analyze the physical properties of the harvested SiC, X-ray diffraction analysis was performed, and as a result, it can be confirmed that the peak of the β phase was the largest as shown in FIG. 11.

Example 9

A conductive heating element made of carbon fiber reinforced carbon (CFRC) was installed in the reactor for chemical vapor deposition and connected to an electrode. The conductive heating element was heated so that the temperature inside the reaction chamber was about 1050° C. (measured by a pyrometer), TCS ($SiHCl_3$) was used as a silicon source precursor, propane ($C_3H_8$) was used as a carbon source precursor, and hydrogen ($H_2$) was used as a carrier gas. They were mixed in a mixer and then vaporized and injected into the reaction chamber. At this time, the atomic ratio of Si:C:H in TCS, propane, and hydrogen each present in the mixed gas was 0.75:1:5.5. The mixed gas was injected at a rate of 10 SLM, and the deposition process was performed at the SiC deposition rate of 30.58 g/hr.

Figure 12:
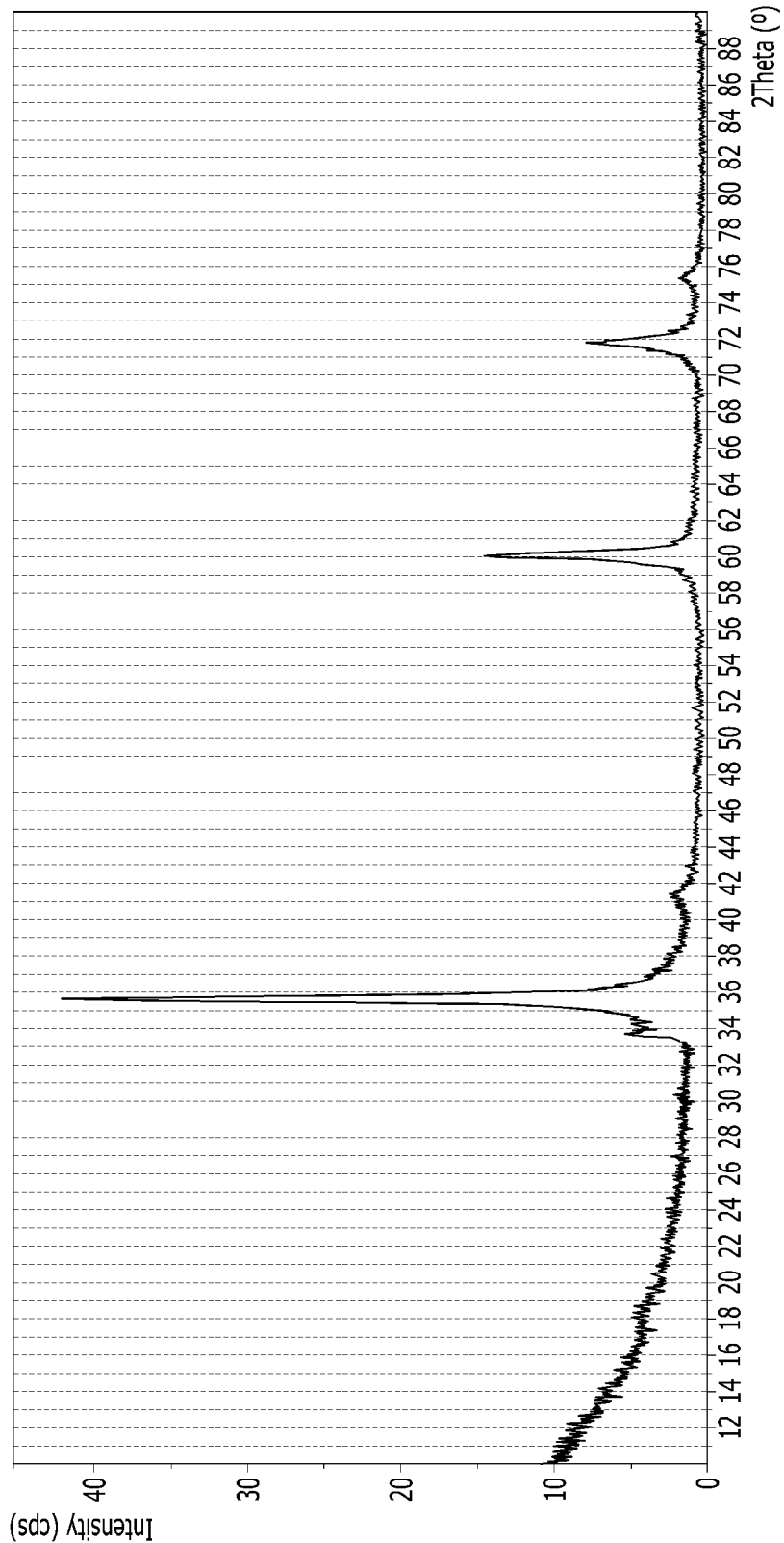

The SiC crystals deposited on the conductive heating element were separated and harvested, and the density of the harvested SiC was 3.18 g/cm$^3$. In order to analyze the physical properties of the harvested SiC, X-ray diffraction analysis was performed, and as a result, it can be confirmed that the peak of the β phase was the largest as shown in FIG. 12.

Example 10

A conductive heating element made of carbon fiber reinforced carbon (CFRC) was installed in the reactor for chemical vapor deposition and connected to an electrode. The conductive heating element was heated so that the temperature inside the reaction chamber became about 1170° C. (measured by a pyrometer), TCS ($SiHCl_3$) was used as a silicon source precursor, propane ($C_3H_8$) was used as a carbon source precursor, and hydrogen ($H_2$) was used as a carrier gas. They were mixed in a mixer and then vaporized and injected into the reaction chamber. At this time, the atomic ratio of Si:C:H in TCS, propane, and hydrogen each present in the mixed gas was 0.75:1:5.5. The mixed gas was injected at a rate of 10 SLM and the deposition process was performed at the SiC deposition rate of 39.66 g/hr.

Figure 13:
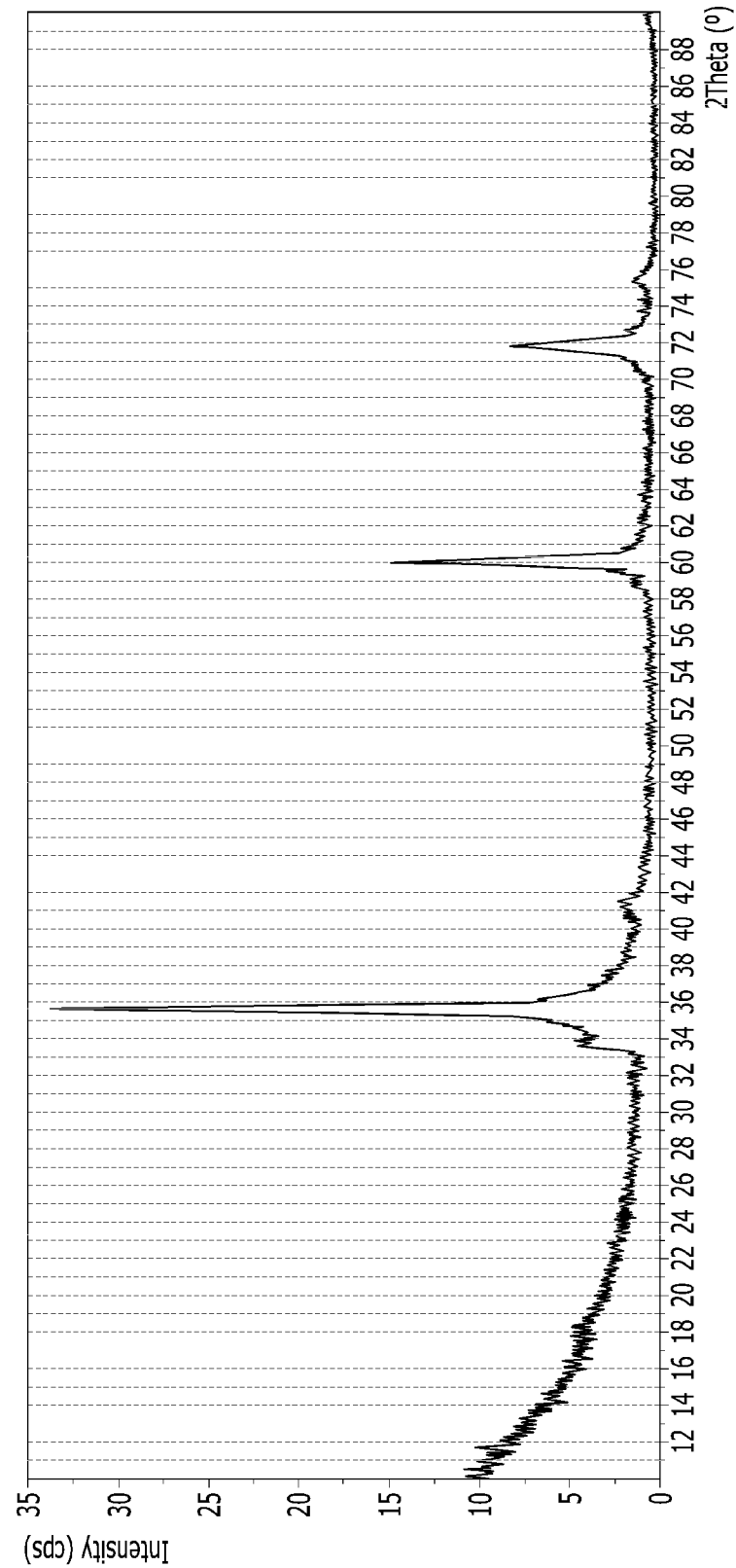

The SiC crystals deposited on the conductive heating element were separated and harvested, and the density of the harvested SiC was 3.20 g/cm$^3$. In order to analyze the physical properties of the harvested SiC, X-ray diffraction analysis was performed, and as a result, it can be confirmed that the peak of the β phase was the largest as shown in FIG. 13.

Example 11

A conductive heating element made of carbon fiber reinforced carbon (CFRC) was installed in the reactor for chemical vapor deposition and connected to an electrode. The conductive heating element was heated so that the temperature inside the reaction chamber was about 1150° C. (measured by a pyrometer), TCS (SiHCl$_3$) was used as a silicon source precursor, propane (C$_3$H$_8$) was used as a carbon source precursor, and hydrogen (H$_2$) was used as a carrier gas. They were mixed in a mixer and then vaporized and injected into the reaction chamber. At this time, the atomic ratio of Si:C:H in TCS, propane, and hydrogen each present in the mixed gas was 0.75:1:5.5. The mixed gas was injected at a rate of 10 SLM and the deposition process was performed at the SiC deposition rate of 30.94 g/hr.

Figure 14:
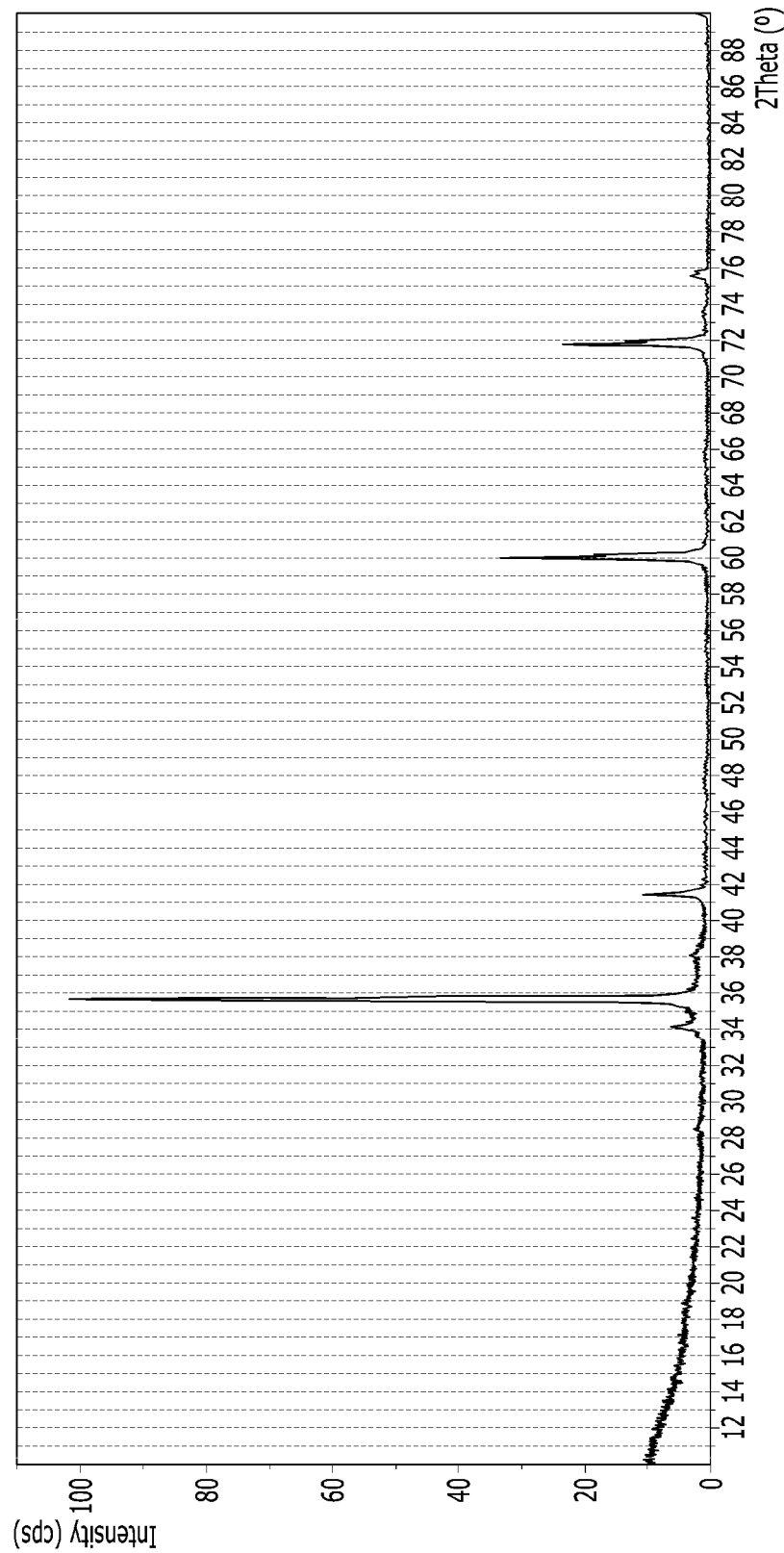

The SiC crystals deposited on the conductive heating element were separated and harvested, and the density of the harvested SiC was 3.16 g/cm$^3$. In order to analyze the physical properties of the harvested SiC, X-ray diffraction analysis was performed, and as a result, it can be confirmed that the peaks of the α and β phases coexist as shown in FIG. 14.

Example 12

The experiment was carried out according to the process flow diagram for preparing high-purity SiC crystals shown in FIG. 1, but a conductive heating element made of carbon fiber reinforced carbon (CFRC) was installed in the reactor for chemical vapor deposition and connected to an electrode. The conductive heating element was heated so that the temperature inside the reaction chamber was about 1500° C. or more (measured by a pyrometer), TCS (SiHCl$_3$) was used as a silicon source precursor, propane (C$_3$H$_8$) was used as a carbon source precursor, and hydrogen (H$_2$) was used as a carrier gas. They were mixed in a mixer and then vaporized and injected into the reaction chamber. At this time, the atomic ratio of Si:C:H in TCS, propane, and hydrogen each present in the mixed gas was 1.5:1:5.5. The mixed gas was injected at a rate of 5 SLM, and the deposition process was performed at the SiC deposition rate of 49.4 g/hr.

Figure 15:
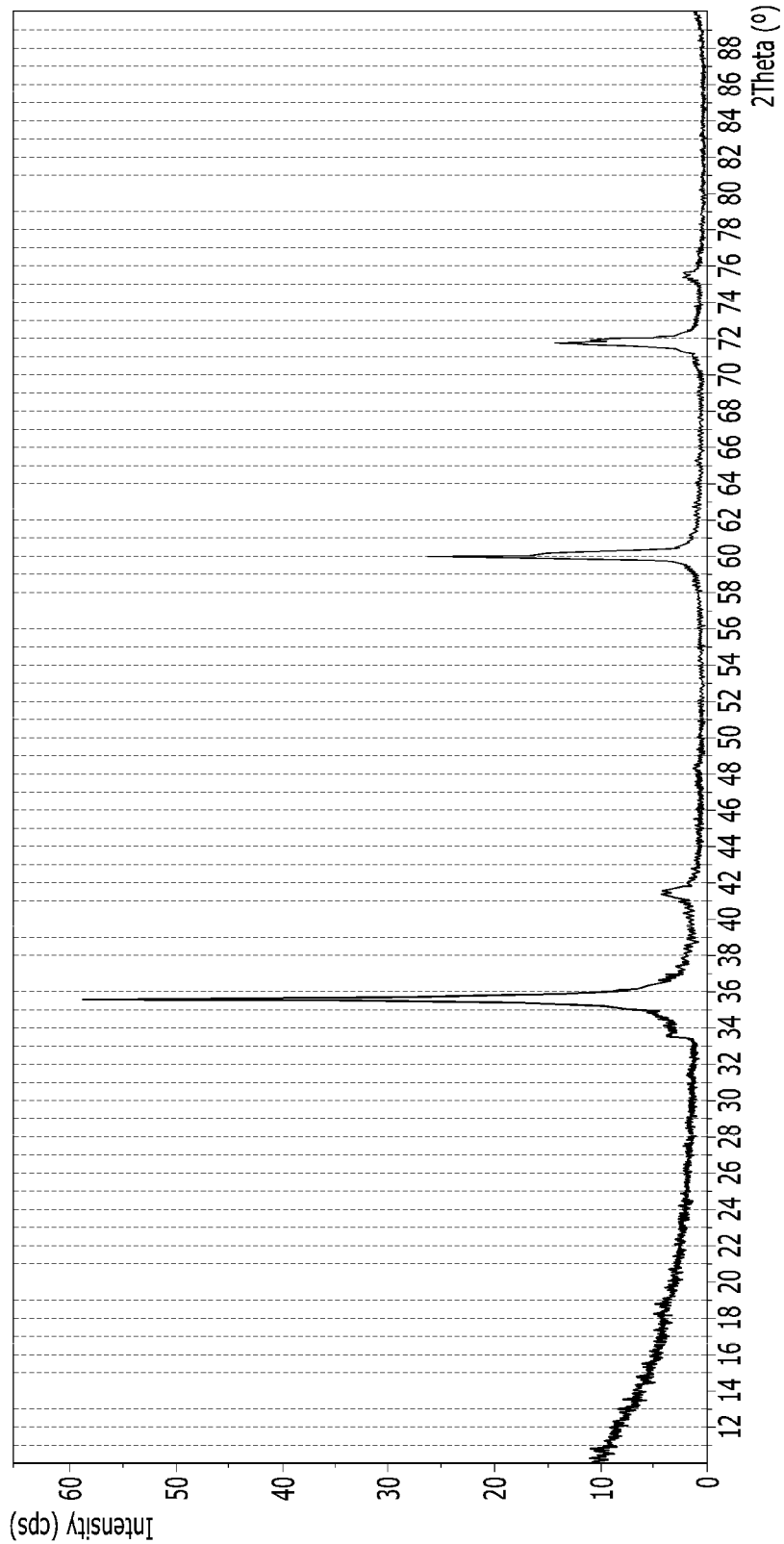

The SiC crystals deposited on the conductive heating element were separated and harvested, and the density of the harvested SiC was 3.15 g/cm$^3$. In order to analyze the physical properties of the harvested SiC, X-ray diffraction analysis was performed, and as a result, it can be confirmed that the peak of the β phase was the largest as shown in FIG. 15.

Example 13

The experiment was carried out according to the process flow diagram for preparing high-purity SiC crystals shown in FIG. 1, but a conductive heating element made of CFRC was installed in the reactor for chemical vapor deposition and connected to an electrode. The conductive heating element was heated so that the temperature inside the reaction chamber was about 1500° C. or more (measured by a pyrometer), TCS (SiHCl$_3$) was used as a silicon source precursor, propane (C$_3$H$_8$) was used as a carbon source precursor, and hydrogen (H$_2$) was used as a carrier gas. They were mixed in a mixer and then vaporized and injected into the reaction chamber. At this time, the atomic ratio of Si:C:H in TCS, propane, and hydrogen each present in the mixed gas was 1:1:5.5. The mixed gas was injected at a rate of 5 SLM and the deposition process was performed at the SiC deposition rate of 40.9 g/hr.

Figure 16:
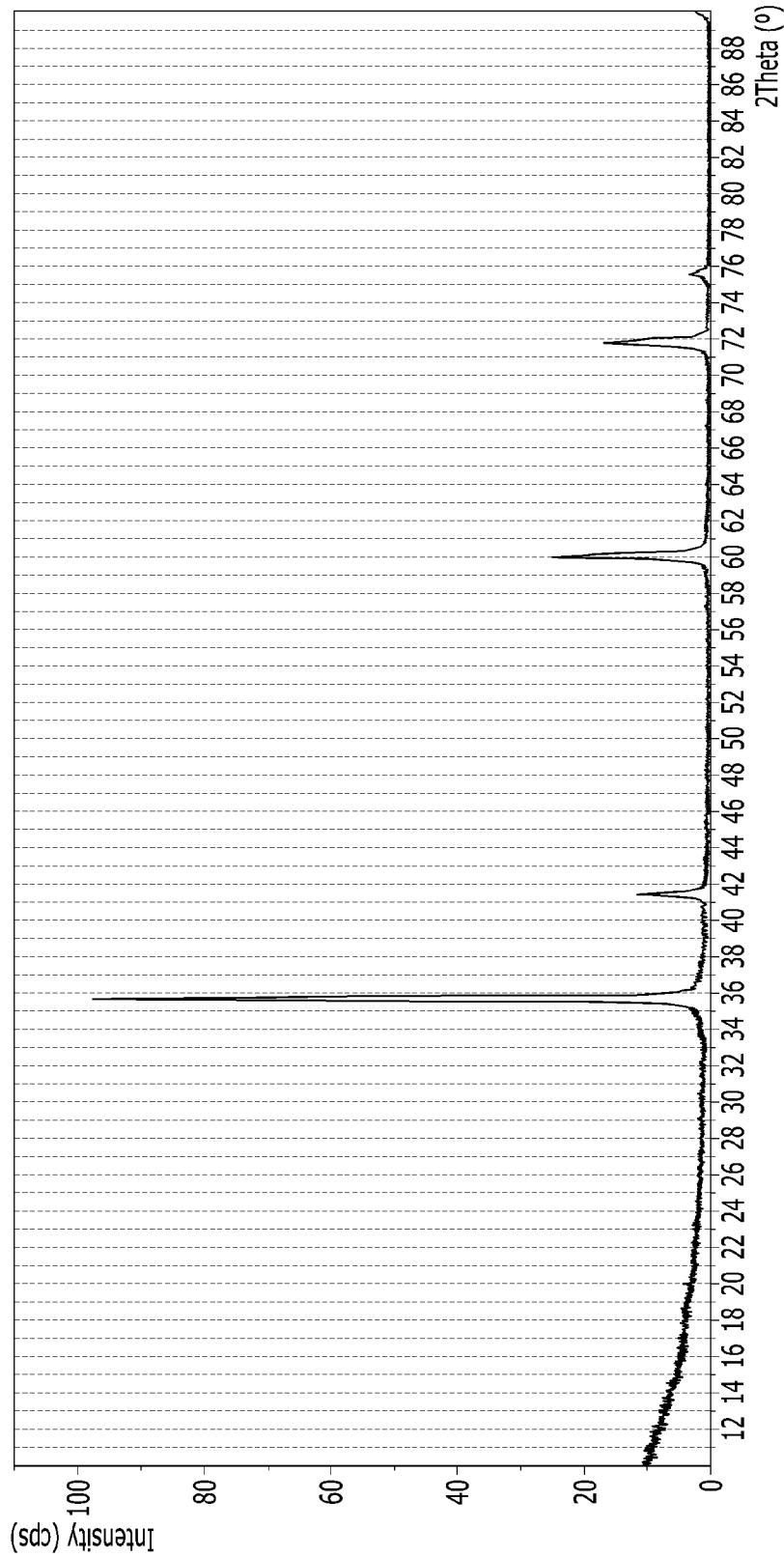

The SiC crystals deposited on the conductive heating element were separated and harvested, and the density of the harvested SiC was 3.18 g/cm$^3$. In order to analyze the physical properties of the harvested SiC, X-ray diffraction analysis was performed, and as a result, it can be confirmed that the peak of the β phase was the largest as shown in FIG. 16.

Example 14

The experiment was carried out according to the process flow diagram for preparing high-purity SiC crystals shown in FIG. 1, but a conductive heating element made of CFRC was installed in the reactor for chemical vapor deposition and connected to an electrode. The conductive heating element was heated so that the temperature inside the reaction chamber became about 1500° C. or more (measured by a pyrometer), TCS (SiHCl$_3$) was used as a silicon source precursor, propane (C$_3$H$_8$) was used as a carbon source precursor, and hydrogen (H$_2$) was used as a carrier gas. They were mixed in a mixer and then vaporized and injected into the reaction chamber. At this time, the atomic ratio of Si:C:H in TCS, propane, and hydrogen each present in the mixed gas was 1:1:5.5. The mixed gas was injected at a rate of 5 SLM and the deposition process was performed at the SiC deposition rate of 41.6 g/hr.

Figure 17:
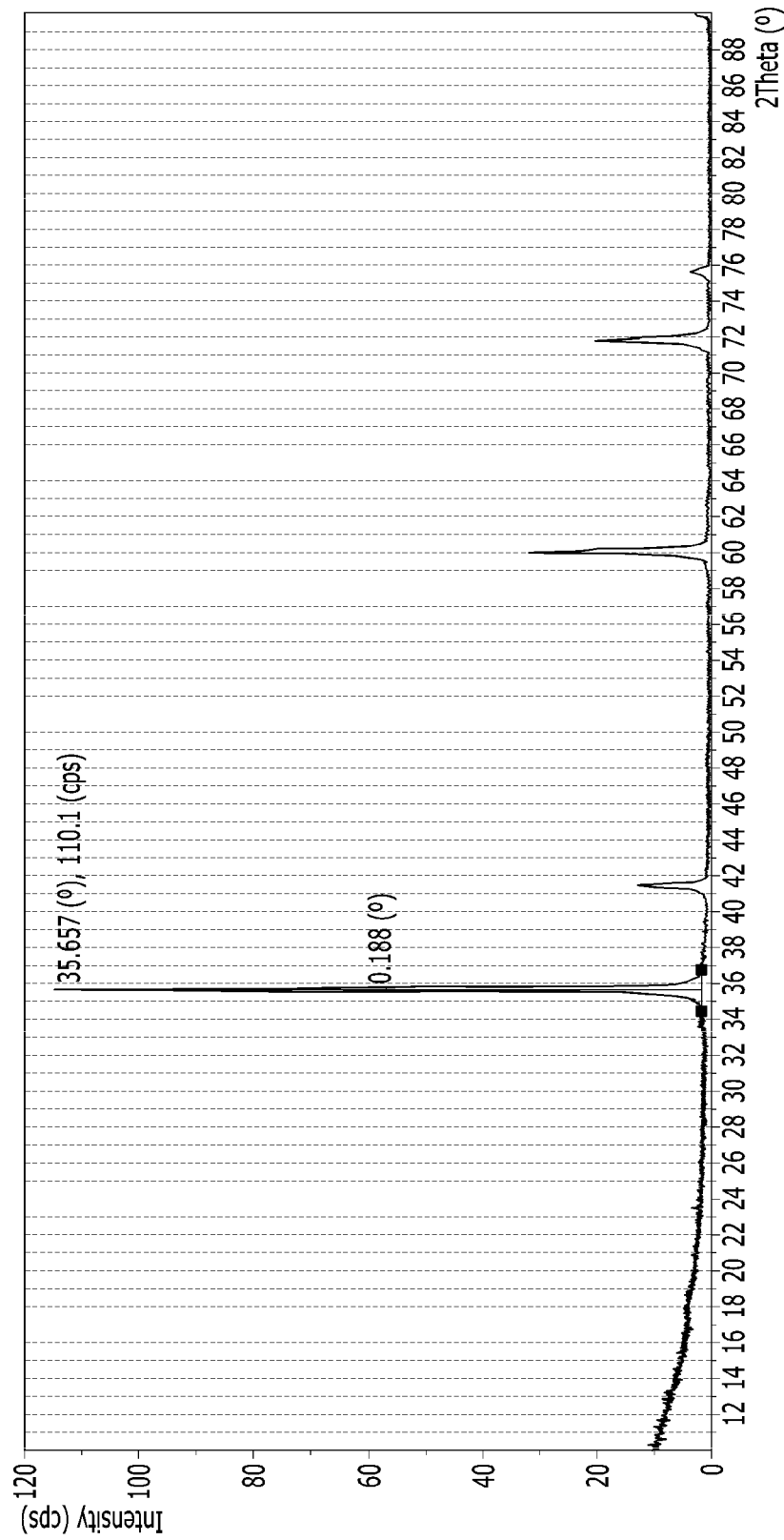
Figure 18:
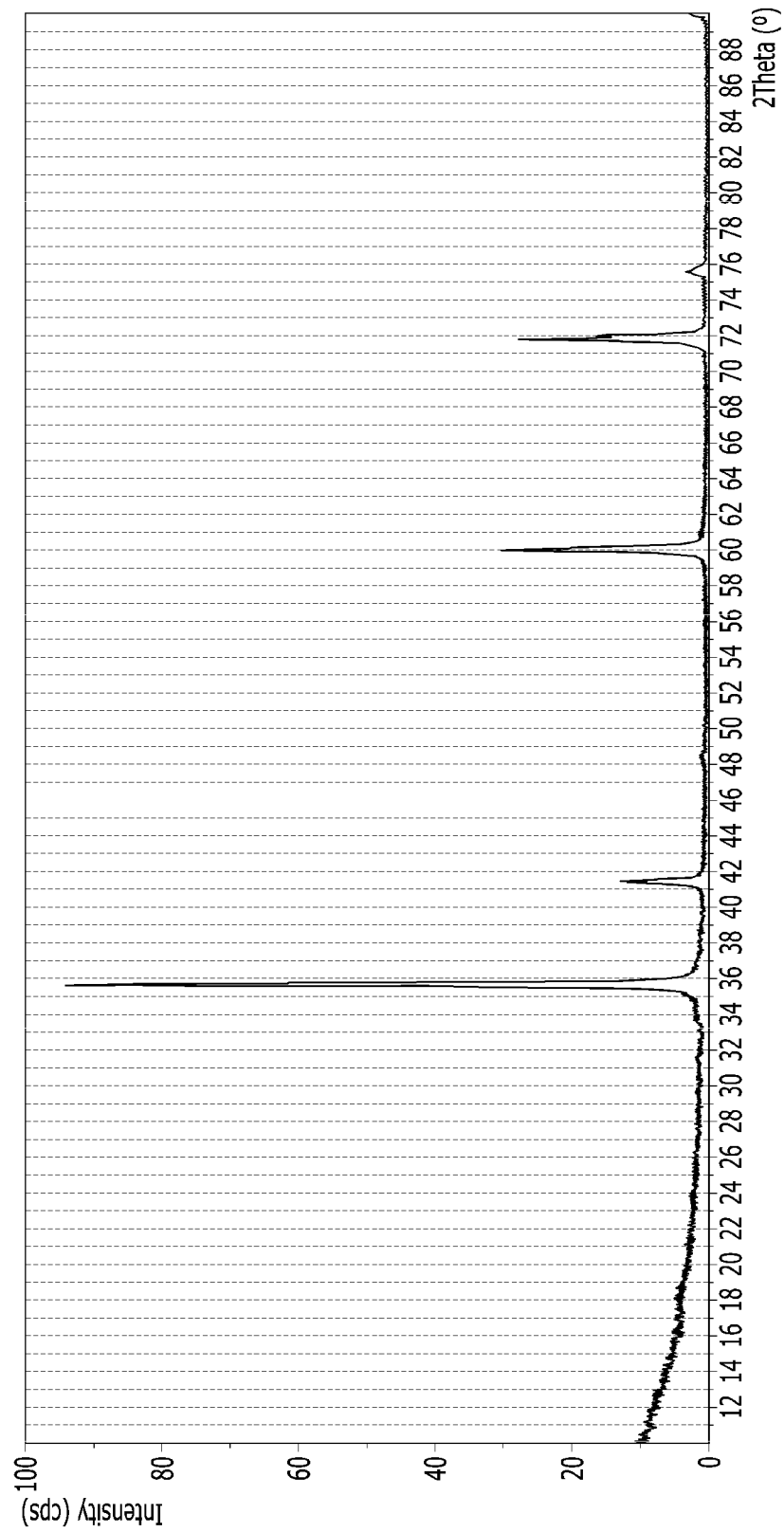

The SiC crystals deposited on the conductive heating element were separated and harvested, and the density of the harvested SiC was 3.19 g/cm$^3$. In order to analyze the physical properties of the harvested SiC, X-ray diffraction analysis was performed, and as a result, it can be confirmed that the peak of the β phase is the largest as shown in FIG. 17.

Example 15

The experiment was carried out according to the process flow diagram for preparing high-purity SiC crystals shown in FIG. 1, but a conductive heating element made of CFRC was installed in a reactor for chemical vapor deposition and connected to an electrode. The conductive heating element was heated so that the temperature inside the reaction chamber was about 1500° C. or more (measured by a pyrometer), TCS (SiHCl$_3$) was used as a silicon source precursor, propane (C$_3$H$_8$) was used as a carbon source precursor, and hydrogen (H$_2$) was used as a carrier gas. They were mixed in a mixer and then vaporized and injected into the reaction chamber. At this time, the atomic ratio of Si:C:H in TCS, propane, and hydrogen each present in the mixed gas was 1:1:5.5. The mixed gas was injected at a rate of 5 SLM, and the deposition process was performed at the SiC deposition rate of 40.6 g/hr.

The SiC crystals deposited on the conductive heating element were separated and harvested, and the density of the harvested SiC was 3.17 g/cm$^3$. In order to analyze the physical properties of the harvested SiC, X-ray diffraction analysis was performed, and as a result, it can be confirmed that the peak of the β phase was the largest as shown in FIG. 17.

Example 16

The experiment was carried out according to the process flow diagram for preparing high-purity SiC crystals shown in FIG. 1, but a conductive heating element made of CFRC was installed in the reactor for chemical vapor deposition and connected to an electrode. The conductive heating element was heated so that the temperature inside the reaction chamber was about 1500° C. or more (measured by a pyrometer), TCS ($SiHCl_3$) was used as a silicon source precursor, propane ($C_3H_8$) was used as a carbon source precursor, and hydrogen ($H_2$) was used as a carrier gas. They were mixed in a mixer and then vaporized and injected into the reaction chamber. At this time, the atomic ratio of Si:C:H in TCS, propane, and hydrogen each present in the mixed gas was 1:1:5.5. The mixed gas was injected at a rate of 5 SLM and the deposition process was performed at the SiC deposition rate of 41.5 g/hr.

Figure 19:
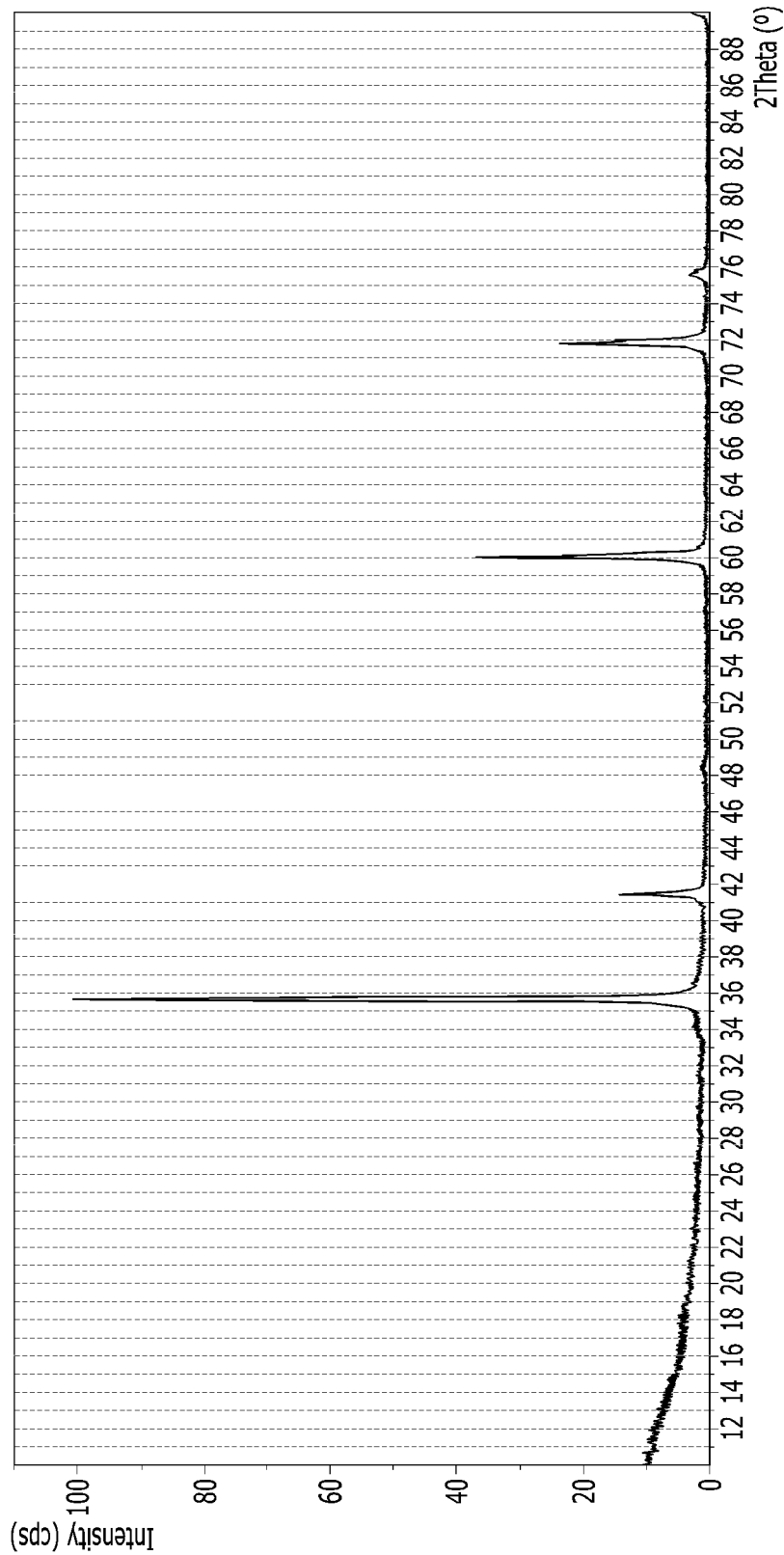

The SiC crystals deposited on the conductive heating element were separated and harvested, and the density of the harvested SiC was 3.17 g/cm³. In order to analyze the physical properties of the harvested SiC, X-ray diffraction analysis was performed, and as a result, it can be confirmed that the peak of the β phase was the largest as shown in FIG. 19.

DESCRIPTION OF MARKS IN THE FIGURES

100: Raw material supply part
200: Reaction part
10: Silicon source precursor supply part
20: Carbon source precursor supply part
30: Carrier gas supply part
40: Mixer
50: Vaporizer
60: Reactor
11, 21, 31: Flow meter
600: Reaction chamber
610: Pair of electrodes
620: Conductive heating element
630: Electrical energy source

The invention claimed is:

1. A method of preparing a high-purity SiC crystal, comprising:
   i) preparing a reactor containing a reaction chamber, wherein the reactor comprises a pair of electrodes connected to a power source and at least one pair of conductive heating elements electrically connected to the electrodes;
   ii) heating the at least one pair of conductive heating elements, wherein the conductive heating element is carbon fiber reinforced carbon (CFRC);
   iii) mixing a silicon source precursor, a carbon source precursor, and a carrier gas;
   iv) injecting the mixed gas into the reaction chamber;
   v) depositing SiC on the at least one pair of conductive heating elements; and
   vi) harvesting the deposited SiC crystals by separating the same from the at least one pair of conductive heating elements,
   wherein an atomic ratio of Si:C between the silicon source precursor and the carbon source precursor in the mixed gas is 0.75 to 1.5:1.

2. The method of claim 1, wherein the temperature inside the reaction chamber is 1,000° C. to 1,500° C.

3. The method of claim 1, wherein the temperature of the conductive heating element is raised to 1,000° C. to 1,800° C.

4. The method of claim 1, wherein the at least one pair of the conductive heating elements has one or more pairs of filaments.

5. The method of claim 1, wherein a SiC deposition rate on the at least one pair of conductive heating elements is 10 g/hr or more.

6. The method of claim 1, wherein the silicon source precursor is one or more selected from trichlorosilane (TCS), dichlorosilane (DCS), silicon tetrachloride (STC) and monosilane.

7. The method of claim 6, wherein the silicon source precursor is trichlorosilane (TCS).

8. The method of claim 1, wherein the carbon source precursor is propane ($C_3H_8$).

9. The method of claim 1, wherein the carrier gas is hydrogen ($H_2$).

10. The method of claim 1, wherein an atomic ratio of Si:C between the silicon source precursor and the carbon source precursor in the mixed gas is 1:1.

* * * * *